(12) United States Patent
Paek et al.

(10) Patent No.: US 11,204,628 B2
(45) Date of Patent: Dec. 21, 2021

(54) FLEXIBLE DISPLAY APPARATUS AND ELECTRONIC DEVICE COMPRISING THE SAME

(71) Applicant: LG Display Co., Ltd., Seoul (KR)

(72) Inventors: SeungHan Paek, Paju-si (KR);
Seongwoo Park, Paju-si (KR);
Dohyung Kim, Paju-si (KR);
SangHoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/727,311

(22) Filed: Dec. 26, 2019

(65) Prior Publication Data
US 2020/0209925 A1 Jul. 2, 2020

(30) Foreign Application Priority Data
Dec. 28, 2018 (KR) .................. 10-2018-0172883

(51) Int. Cl.
*G06F 1/16* (2006.01)
*G02F 1/1333* (2006.01)
*G09F 9/30* (2006.01)
*H04M 1/02* (2006.01)

(52) U.S. Cl.
CPC ...... *G06F 1/1652* (2013.01); *G02F 1/133305* (2013.01); *G09F 9/301* (2013.01); *H04M 1/0268* (2013.01)

(58) Field of Classification Search
None
See application file for complete search history.

(56) References Cited

U.S. PATENT DOCUMENTS

| 2016/0209874 | A1* | 7/2016 | Choi | H05K 1/028 |
| 2016/0308151 | A1* | 10/2016 | Kim | H01L 51/5253 |
| 2017/0373121 | A1* | 12/2017 | Leng | H01L 27/32 |
| 2018/0151644 | A1 | 5/2018 | Han et al. | |
| 2019/0204872 | A1* | 7/2019 | Lee | G06F 1/1616 |

FOREIGN PATENT DOCUMENTS

| KR | 10-2018-0002047 A | 1/2018 |
| KR | 10-2018-0059645 A | 6/2018 |

\* cited by examiner

*Primary Examiner* — Christopher R Lamb
(74) *Attorney, Agent, or Firm* — Morgan, Lewis & Bockius LLP

(57) ABSTRACT

A flexible display apparatus includes: a glass supporting member including a flat portion and a step difference portion overlapping the flat portion; a flexible substrate in the step difference portion of the glass supporting member; and a display portion including a plurality of pixels on the glass supporting member and the flexible substrate.

10 Claims, 14 Drawing Sheets

FLEXIBLE DISPLAY APPARATUS AND ELECTRONIC DEVICE COMPRISING THE SAME

This application claims the benefit of the Korean Patent Application No. 10-2018-0172883 filed on Dec. 28, 2018, which is incorporated herein by reference for all purposes as if fully set forth herein.

BACKGROUND

Technical Field

The present disclosure relates to a flexible display apparatus and an electronic device comprising the same.

Discussion of the Related Art

Generally, a display apparatus is widely used as a display screen of various electronic devices. Such electronic devices include: a mobile communication terminal, electronic diary, electronic book, portable multimedia player, navigator, Ultra Mobile Personal Computer, mobile phone, smart phone, tablet personal computer, watch phone, electronic pad, wearable device, portable information device, vehicle control display device, television, notebook computer, and/or monitor.

Because each of a liquid crystal display apparatus, a light emitting display apparatus and an electrophoresis display apparatus may have a thin profile, studies and development for embodying such apparatuses as flexible display apparatuses are ongoing. In a flexible display apparatus, a display portion that includes a thin film transistor and lines are formed on a flexible substrate. Because the flexible display apparatus is able to display an image even though the apparatus is bent, the flexible display apparatus may be used for various display applications.

In a manufacturing method of a general flexible display apparatus, after a laser sacrificial layer and a flexible substrate are sequentially formed on a mother glass substrate, a manufacturing process of a flexible display panel is completed. Then, the mother glass substrate is detached (or separated) from the flexible substrate through a laser release process for irradiating lasers to the laser sacrificial layer, whereby the flexible display panel is manufactured.

Because expensive laser equipment is used to detach the mother glass substrate from the flexible substrate, manufacturing cost is increased, and a laser release related defect (e.g., particles or transfer according to surface roughness of the flexible substrate) may be generated. Particularly, as a flexible substrate material occupying approximately half of the manufacturing cost of the flexible display panel is coated on an entire surface of the mother glass substrate, material consumption is high and production cost is increased.

Finally, studies and development of a display apparatus that may embody a maximum screen by reducing a bezel area where an image is not displayed in a size of the same display panel are ongoing.

SUMMARY

Accordingly, example embodiments of the present disclosure are directed to a flexible display apparatus and an electronic device comprising the same that substantially obviate one or more of the problems due to limitations and disadvantages of the related art.

An aspect of the present disclosure is to provide a flexible display apparatus manufactured without a laser release process.

Another aspect of the present disclosure is to provide a mother glass substrate that may be detached from a flexible substrate.

Yet another aspect of the present disclosure is to provide a flexible display apparatus and an electronic device comprising the same have improved reliability, and a reduced or minimized bezel area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display apparatus includes: a glass supporting member including a flat portion and a step difference portion overlapping the flat portion; a flexible substrate in the step difference portion of the glass supporting member; and a display portion including a plurality of pixels on the glass supporting member and the flexible substrate.

In another aspect, an electronic device includes: a display portion including first and second flat display areas that are parallel to each other, and a bending display area between the first flat display area and the second flat display area; a flexible substrate supporting the bending display area; a glass supporting member including a first supporting portion supporting the first flat display area and a first side edge area of the flexible substrate, a second supporting portion supporting the second flat display area and a second side edge area of the flexible substrate, and a flexible filler between the first supporting portion and the second supporting portion; a first middle frame supporting the first supporting portion; a second middle frame supporting the second supporting portion; and a hinge portion supporting each of the first middle frame and the second middle frame.

In yet another aspect, an electronic device includes: a cover window including a front window and a curved window that is curved from the front window; and a flexible display module including a flexible display panel coupled to the front window, wherein the flexible display panel includes: a display portion including a flat display area attached to the front window and first and second bending display areas extended from the flat display area and attached to the curved window; and a glass supporting member supporting the flat display area; a first flexible substrate supported at a first side edge area of the glass supporting member, supporting the first bending display area; and a second flexible substrate supported at a second side edge area of the glass supporting member, supporting the second bending display area.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate example embodiments of the disclosure and together with the description serve to explain various principles. In the drawings.

DETAILED DESCRIPTION

Figure 1:
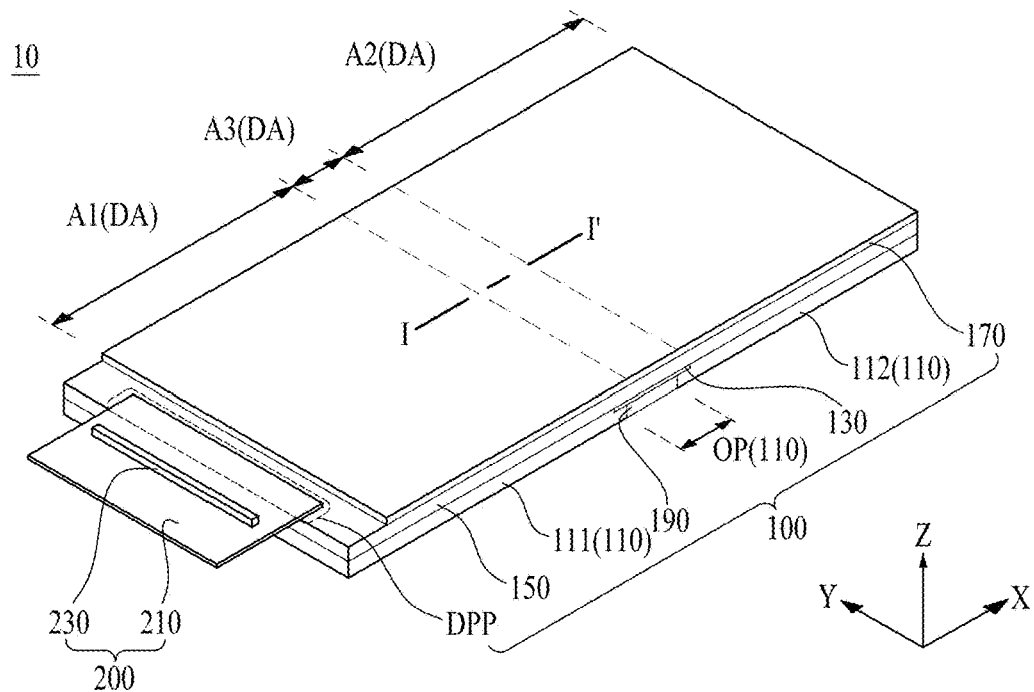
FIG. 1 illustrates a flexible display apparatus according to one example embodiment.

Reference will now be made in detail to example embodiments of the present disclosure, examples of which are illustrated in the accompanying drawings.

A shape, a size, a ratio, an angle, and a number disclosed in the drawings for describing example embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary. In construing an element, the element is construed as including an error range although there is no explicit description. In describing a position relationship, for example, when the position relationship is described as 'upon~', 'above~', 'below~', and 'next to~', one or more portions may be arranged between two other portions unless 'just' or 'direct' is used. In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various example embodiments of the present disclosure may be partially or overall coupled to or combined with each other, variously inter-operated with each other, and driven technically, as those skilled in the art can sufficiently understand. The example embodiments of the present disclosure may be carried out independently from each other, or may be carried out together in co-dependent relationship. Hereinafter, a flexible display apparatus and an electronic device comprising the same according to the present disclosure will be described in detail with reference to the accompanying drawings. Wherever possible, the same reference numbers will be used throughout the drawings to refer to the same or like parts. Because a scale of each of the elements illustrated in the accompanying drawings is different from an actual scale for convenience of description, the present disclosure is not limited to the illustrated scale.

Figure 2:
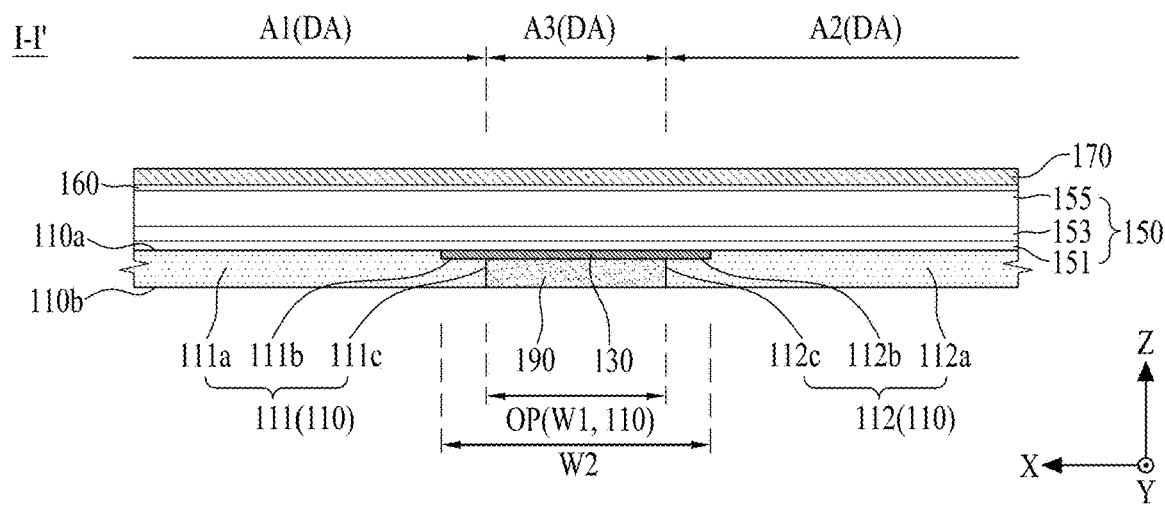
FIG. 2 is a cross-sectional view taken along line I-I' illustrated in FIG. 1.

FIG. 1 illustrates a flexible display apparatus according to one example embodiment. FIG. 2 is a cross-sectional view taken along line I-I' illustrated in FIG. 1. As illustrated in FIGS. 1 and 2, the flexible display apparatus 10 according to one example embodiment may include a flexible display panel 100 and a panel driving circuit 200. The flexible display panel 100 may be a flexible light emitting display panel, a flexible organic light emitting display panel, a flexible liquid crystal display panel, a flexible electrophoresis display panel, a flexible electro-wetting display panel, a flexible micro light emitting diode display panel, or a flexible quantum dot light emitting display panel. In the following description, it is assumed that the flexible display panel 100 is a flexible organic light emitting display panel.

The flexible display panel 100 may be configured such that at least a portion of a display area DA is bent in a curved shape or folded in a curved shape to have a certain interval. The flexible display panel 100 may include at least one first flat display area A1 (or first area), at least one second flat display area A2 (or second area), and a bending display area A3 (or third area) arranged between the first flat display area A1 and the second flat display area A2. The first and second flat display areas A1 and A2 and the bending display area A3 embodies one screen where images of one frame are continuously displayed without disconnection.

The first flat display area A1, the second flat display area A2, and the bending display area A3. For example, based on a first direction X parallel with a first length direction (or long side length direction) of the flexible display panel 100, the first flat display area A1 may be arranged at one side (or left area) of the flexible display panel 100. The second flat display area A2 may be arranged at the other side (or right area) of the flexible display panel 100. And the bending display area A3 may be arranged between the first flat display area A1 and the second flat display area A2.

The bending display area A3 may be maintained in a plane state together with the first flat display area A1 and the second flat display area A2 or bent or folded in a curved shape. Therefore, the flexible display panel 100 may be bent or folded to have a certain curvature radius in accordance with bending of the bending display area A3. Based on the first direction X, a first width W1 of the bending display area A3 may be set in accordance with the curvature radius of the flexible display panel 100 bent or folded in a curved shape.

The flexible display panel 100 according to one example embodiment may include a glass supporting member 110, a flexible substrate 130, and a display portion 150. The glass supporting member 110 is a base substrate or support substrate of the flexible display apparatus 10, and supports the flexible substrate 130 and the display portion 150. The glass supporting member 110 may include a glass material. For example, the glass supporting member 110 may include a soda-lime glass or a non-alkali glass. The glass supporting member 110 may include a display manufacturing glass widely used to manufacture a flat display panel.

The glass supporting member 110 is used as a base substrate or support substrate of the flexible display panel 100 without being removed even after the manufacturing process of the flexible display panel 100 is completed. A laser release process for removing or detaching the glass supporting member 110 from the flexible display panel 100 after the manufacturing process of the flexible display panel 100 is completed may be omitted. Therefore, because the flexible display panel 100 may be manufactured even without using an expensive laser equipment, the manufacturing cost of the flexible display apparatus 10 may be reduced. Also, a defect (particles or transfer according to surface roughness of the flexible substrate) according to the laser release process may be avoided, and flatness of the flat display areas A1 and A2 may uniformly be maintained.

The glass supporting member 110 according to one example embodiment may have a thickness of 0.01 mm to 1.0 mm to maintain flatness of the display portion 150 or shield permeation of water or oxygen into the display portion 150. However, its thickness may be changed depending on a size of the flexible display apparatus 10. The glass supporting member 110 according to another example embodiment may have a thickness of 0.01 mm to 0.5 mm to be bent together with the flexible substrate 130 while shielding permeation of water or oxygen into the flexible display panel 100, but its thickness may be changed depending on a size of the flexible display apparatus 10.

The glass supporting member 110 according to one example embodiment may include a first supporting portion 111, a second supporting portion 112, and an open portion OP. The first supporting portion 111 may maintain flatness of the first flat display area A1 by supporting edge areas at one sides of the first flat display area A1 and the flexible substrate 130. The first supporting portion 111 according to one example embodiment may include a first plane portion 111a (or flat portion), a first step difference portion 111b, and a first glass etching surface 111c. The first plane portion 111a is configured in a flat panel shape and supports the first flat display area A1. The first plane portion 111a according to one example embodiment may have a panel shape having a size corresponding to the first flat display area A1 and a certain thickness.

The first step difference portion 111b (or the first step portion) may be arranged at an edge area of one side (inner side) of the first plane portion 111a, and supports an edge area of one side of the flexible substrate 130. The first step difference portion 111b according to one example embodiment may be formed to have a certain depth from an upper surface 110a of the edge area at one side of the first plane portion 111a overlapped with the edge area at one side of the flexible substrate 130. For example, a depth (or height) of the first step difference portion 111b may be set to a half or less of an overall thickness of the glass supporting member 110.

The first step difference portion 111b may be formed to be recessed from the upper surface 110a of the edge area at one side of the first plane portion 111a by a first glass etching process using an etching solution, which can melt a glass material, without using a laser scribing process. Therefore, because the first step difference portion 111b is formed to be recessed at the edge area of one side of the first plane portion 111a, the first step difference portion 111b may be referred to as a recessed portion or a groove portion. For example, the first glass etching process may be a wet etching process using an etching solution containing hydrofluoric acid (HF).

The first glass etching surface 111c may be connected to the first step difference portion 111b and exposed to one side of the open portion OP. The first glass etching surface 111c may be an inner side of the first plane portion 111a arranged between a lower surface 110b of the first plane portion 111a and the first step difference portion 111b and exposed to one side of the open portion OP, based on a thickness direction Z of the flexible display panel 100. The first glass etching surface 111c may be formed by a second glass etching process for forming the open portion OP in a mother glass substrate using an etching solution, which can melt a glass material, without using a laser scribing process. Because the first glass etching surface 111c is formed by the glass etching process, and not the laser scribing process, the first glass etching surface 111c may have an inclined forward tapered structure or inverse tapered structure. For example, the second glass etching process may be a wet etching process using an etching solution containing hydrofluoric acid (HF).

The second supporting portion 112 may maintain flatness of the second flat display area A2 by supporting edge areas at the other sides of the second flat display area A2 and the flexible substrate 130. The second supporting portion 112 according to one example embodiment may include a second plane portion 112a or flat portion, a second step difference portion 112b, and a second glass etching surface 112c. The second supporting portion 112 having these elements may have a symmetrical structure with the first supporting portion 111 based on the open portion OP.

The second plane portion 112a is configured in a flat panel shape and supports the second flat display area A2. The second plane portion 112a according to one example embodiment may have a size corresponding to the second flat display area A2 and a certain thickness. The second step difference portion 112b (or the second step portion) may be arranged at an edge area of one side (inner side) of the second plane portion 112a, and supports an edge area of the other side of the flexible substrate 130. The second step difference portion 112b according to one example embodiment may be formed to have a certain depth from an upper surface 110a of the edge area at one side of the second plane portion 112a overlapped with the edge area at the other side of the flexible substrate 130.

For example, a depth (or height) of the second step difference portion 112b may be set to a half or less of an overall thickness of the glass supporting member 110. The second step difference portion 112b may be formed to be recessed from the upper surface 110a of the edge area at one side of the second plane portion 112a by the first glass etching process. Therefore, because the second step difference portion 112b is formed to be recessed at the edge area of one side of the second plane portion 112a, the second step difference portion 112b may be referred to as a recessed portion or a groove portion. The second step difference portion 112b may be formed together with the first step difference portion 111b by the first glass etching process. The first step difference portion 111b and the second step difference portion 112b may simultaneously be formed by the first glass etching process for etching (or partially removing) a bending area of each of a plurality of panel areas defined in the mother glass substrate at a certain depth.

The second glass etching surface 112c may be connected to the second step difference portion 112b and exposed to the other side of the open portion OP. The second glass etching surface 112c may be an inner side of the second plane portion 112a arranged between a lower surface 110b of the second plane portion 112a and the second step difference portion 112b and exposed to the other side of the open portion OP, based on the thickness direction Z of the flexible display panel 100. The second glass etching surface 112c may be formed by the second glass etching process for forming the open portion OP in a mother glass substrate. Because the second glass etching surface 112c is formed by the glass etching process, and not the laser scribing process, the second glass etching surface 112c may have an inclined forward tapered structure or inverse tapered structure.

The open portion OP is arranged between the first supporting portion 111 and the second supporting portion 112 to overlap the bending display area A3. The open portion OP may have a first width W1 corresponding to the bending display area A3, based on the first direction X. The open portion OP may be arranged on a rear surface of the flexible substrate 130 to smoothly bend the bending display area A3. The open portion OP is provided by partially removing the glass supporting member 110 overlapped with the bending display area A3, whereby bending stress including compressive stress and tensile stress applied to the bending display area A3 during bending of the bending display area A3.

The open portion OP is formed by partial etching (or partial removal) from the mother glass substrate of a flat panel shape in accordance with the second glass etching process performed after the manufacturing process of the flexible display panel 100 is completed. Therefore, the open portion OP includes a first glass etching surface 111c of the first supporting portion 111 and a second glass etching surface 112c of the second supporting portion 112c. The first width W1 of the open portion OP may be set to a reduced or minimum distance between the first glass etching surface 111c and the second glass etching surface 112c. Optionally, the open portion OP may be formed by the laser scribing process, and not the glass etching process, but a problem occurs in that an expensive laser equipment is used.

Also, a problem occurs in that additional grinding process for a cut surface and additional washing process for removing glass scraps (or fragments) generated during the laser scribing process and the grinding process are required because the cut surface is formed substantially vertically. On the other hand, because the open portion OP according to the glass etching process has a forward tapered structure or inverse tapered structure having an inclined surface along an etching process condition, the open portion OP has advantages in that additional grinding process and additional washing process are not required.

The flexible substrate 130 is arranged on the step difference portion 111b and 112b and the open portion OP of the glass supporting member 110 and supports the bending display area A3 to bend the bending display area A3. For example, the flexible substrate 130 may include a plastic material to allow the bending display area A3 to be bent or folded in a curved shape. For example, the flexible substrate 130 may include any one material of polyimide (PI), polycarbonate (PC), polyethyleneterephthalate (PET), polymethylpentene (PMP), polymethylmethacrylate (PMMA), polynorborneen (PNB), polyethylenapthanate (PEN), polyethersulfone (PES), and cycloolefin copolymer (COC). The flexible substrate 130 may include a polyimide (PI) material.

The flexible substrate 130 according to one example embodiment may be formed by being filled and hardened in the step difference portions 111b and 112b formed by the first glass etching process for the mother glass substrate that is not provided with the open portion OP. Therefore, the flexible substrate 130 is directly coupled with (or in contact with) the step difference portions 111b and 112b of the glass supporting member 110 without an intermediate layer such as an adhesive layer.

Therefore, the present disclosure may reduce material consumption of the flexible substrate 130 arranged between the glass supporting member 110 and the display portion 150 and used as a support layer of the display portion 150. The flexible substrate material that occupies a half level of the material cost of the flexible display panel 100 may be coated on only the step difference portions 111b and 112b without being formed on the entire surface of the mother glass substrate. As such, material consumption may be reduced and production cost of the flexible display apparatus 10 may be reduced.

The flexible substrate 130 according to one example embodiment may have a second width W2 wider than the first width W1 of the bending display area A3 (or the open portion OP) based on the first direction X. The flexible substrate 130 according to one example embodiment may have a second width W2 obtained by adding a width of each of the first step difference portion 111b of the first supporting portion 111 and the second step difference portion 112b of the second supporting portion 112 to the first width W1 of the bending display area A3 (or the open portion OP), based on the first direction X. For example, the second width W2 of the flexible substrate 130 may be set to 1.5 times or more of the first width W1 of the bending display area A3 (or the open portion OP). As the flexible substrate 130 has a size overlapped with the bending display area A3, the flexible substrate 130 may be referred to as a flexible local substrate. The display portion 150 is arranged on the glass supporting member 110 and the flexible substrate 130, and displays an image through the first flat display area A1, the second flat display area A2 and the bending display area A3. The display portion 150 may be referred to as a pixel array portion.

The display portion 150 according to one example embodiment may include a buffer layer 151, a pixel array layer 153, and an encapsulation layer 155. The buffer layer 151 is formed to cover the glass supporting member 110 and the flexible substrate 130. For example, the buffer layer 151 may be formed on an entire front surface of each of the plane portions 111a and 112a of each of the first and second supporting portions 111 and 112 of the glass supporting member 110 and the flexible substrate 130. The buffer layer 151 serves to prevent water from being permeated into the pixel array layer 153 through the flexible substrate 130. Also, the buffer layer 151 may serve to prevent impurities such as metal ions from the flexible substrate 130 and the glass supporting member 110 from being diffused and then permeated into the pixel array layer 153. The buffer layer 151 according to one example embodiment may be formed of a multi-layered film of one or more inorganic films of SiOx, SiNx and SiON that are alternately deposited.

The pixel array layer 153 includes a plurality of pixels provided in a pixel area defined by pixel driving lines provided on a display area DA defined on the buffer layer 151, displaying an image in accordance with signals supplied to the pixel driving lines. The pixel driving lines may include data and gate lines and pixel driving power lines. Each of the plurality of pixels may include a pixel circuit layer including a driving thin film transistor provided in a pixel area, an anode electrode electrically connected with the driving thin film transistor, a light emitting diode layer formed on the anode electrode, and a cathode electrode electrically connected with the light emitting diode layer. The driving thin film transistor is provided in a transistor area of each pixel area defined on the buffer layer 151, and may include a gate electrode, a gate insulating film, a semiconductor layer, a source electrode, and a drain electrode. A semiconductor layer of the thin film transistor may include a silicon such as a-Si, poly-Si, or low temperature poly-Si, or may include an oxide, such as Indium-Gallium-Zinc-Oxide (IGZO).

The anode electrode is provided in an open area defined in each pixel area in a pattern shape and therefore electrically connected with the driving thin film transistor. The light emitting diode layer according to one example embodiment may include an organic light emitting diode formed on the anode electrode. The organic light emitting diode may be formed to emit light of the same color per pixel, for example, white light, or may be formed to emit light of a color different per pixel, for example, red light, green light or blue light.

The light emitting diode layer according to another example embodiment may include a micro light emitting diode element electrically connected with each of the anode electrode and the cathode electrode. The micro light emitting diode element is a light emitting diode configured in the form of an integrated circuit (IC) or chip, and may include a first terminal electrically connected with the anode electrode and a second terminal electrically connected with the cathode electrode. The cathode electrode may commonly be connected with the light emitting diode layers provided in each pixel area.

The encapsulation layer 155 may be formed on the buffer layer 151 to surround the pixel array layer 153, thereby preventing oxygen or water from being permeated into the light emitting diode layer of the pixel array layer 153. The encapsulation layer 155 according to one example embodiment may be formed in a multi-layered structure in which an organic material layer and an inorganic material layer are alternately deposited. The inorganic material layer may serve to shield oxygen or water from being permeated into the light emitting diode layer of the pixel array layer 153. The organic material layer may be formed to be relatively thicker than the inorganic material layer to cover particles that may be generated during a manufacturing process. For example, the encapsulation layer 155 may include a first inorganic film, an organic film on the first inorganic film, and a second inorganic film on the organic film. The organic film may be defined as a particle cover layer.

The flexible display panel 100 according to one example embodiment may further include a display pad portion DPP, and a gate driving circuit portion. The display pad portion DPP may include a plurality of pad electrodes arranged on a first edge area of the buffer layer 151 spaced apart from the pixel array layer 153. Each of the plurality of pad electrodes may be connected the pixel driving line arranged in the pixel array layer 153 through one or more of a plurality of link lines.

The gate driving circuit portion may be formed on a second and/or a third edge area of the buffer layer 151, may be connected with one end and/or the other end of each of a plurality of gate lines. The gate driving circuit portion generates a gate signal in response to a gate control signal supplied through the display pad portion DPP and supplies the generated gate signal to each of the plurality of gate lines. The gate driving circuit portion may be a gate built-in circuit formed together with the manufacturing process of the thin film transistor of the pixel. The flexible display panel 100 according to one example embodiment may further include a cover film 170 arranged on the encapsulation layer 155. The cover film 170 may be attached to the encapsulation layer 155 by an adhesive member 160. The adhesive member 160 may include a pressure sensitive adhesive (PSA), an optically clear adhesive (OCA), or an optically clear resin (OCR).

The cover film 170 according to one example embodiment may include an anti-reflection layer (or anti-reflection film) for improving outdoor visibility and contrast ratio for an image displayed on the flexible display apparatus by preventing reflection of external light. For example, the anti-reflection layer may include a circular polarizing layer (or circular polarizing film) that shields reflective light reflected by the thin film transistor and/or lines arranged on the pixel array layer 153 from progressing to the outside. The cover film 170 may further include a barrier layer (or barrier film) for primarily preventing water or oxygen permeation, wherein the barrier layer may be made of a material having low water permeability, for example, polymer material.

Also, the cover film 170 may further include a light path controlling layer (or light path controlling film) for controlling a path of light emitted from the pixel array layer 153 to the outside. The light path controlling layer may include a structure that a high refractive layer and a low refractive layer are deposited alternately, whereby a path of light incident from the pixel array layer 153 may be changed to reduce or minimize color shifting according to a viewing angle. The flexible display panel 100 according to one example embodiment may further include a touch electrode portion. The touch electrode portion serves as a touch sensor arranged between the cover film 170 and the encapsulation layer 155, sensing a user's touch. The cover film 170 may be attached to the touch electrode portion by a film adhesive member.

The touch electrode portion according to one example embodiment may include a touch electrode layer arranged on the encapsulation layer 155 overlapped with the pixel array layer 153, and a dielectric layer covering the touch electrode layer. Optionally, the touch electrode portion may be formed on a touch buffer layer covering the encapsulation layer 155. The touch electrode layer may include a plurality of touch driving electrodes arranged on the encapsulation layer 155 overlapped with the pixel array layer 153 at constant intervals, and a plurality of touch sensing electrodes electrically insulated from the plurality of touch driving electrodes. The touch sensing electrodes may be arranged on the same layer as the touch driving electrodes, or may be arranged on their respective layers different from each other by interposing the dielectric layer therebetween.

The touch electrode portion according to another example embodiment may be replaced with a capacitance type touch panel known in the art. The touch panel may be attached to the encapsulation layer 155 by an adhesive member. The flexible display panel 100 according to one example embodiment may further include a filler 190 (or elastic portion).

The filler 190 may be filled (or buried) in the open portion OP provided in the glass supporting member 110. The filler 190 may shield water or oxygen from being permeated into the flexible substrate 130 through the open portion OP. Also, the filler 190 may prevent lamination between the first supporting portion 111 and the second supporting portion 112, which are adjacent to the open portion OP, during repeated bending (or folding) of the flexible display panel 100. The open portion OP filled with the filler 190 may be defined as an elastic portion of the glass supporting member 110. The glass supporting member 110 may include an elastic portion 190 connected between the first supporting portion 111 and the second supporting portion 112. At this time, the supporting portions 111 and 112 and the elastic portion 190 of the glass supporting member 110 may be made of their respective materials different from each other.

Because the filler 190 is formed in the open portion OP overlapped with the bending display area A3 of the flexible display panel 100, a shape according to a width and thickness of the filler 190 may be set based on a position of a neutral plane according to compressive stress and tensile stress applied to the bending display area A3 of the flexible display panel 100. This may occur during bending (or folding) of the bending display area A3 of the flexible display panel 100.

The filler 190 according to one example embodiment may be formed by being hardened by a photo-hardening process after a liquid resin, for example, organic resin is filled (or buried) in the open portion OP through a jetting process or a dispensing process. This filler 190 may be made of a liquid resin and filled (or permeated) into a gap between the etching surfaces 111c and 112c of the glass supporting member 110 adjacent to the open portion OP and the flexible substrate 130. To this end, the filler 190 may include a material having moisture-proofing characteristic and/or an adhesive characteristic, and may include an optical bond hardened by UV. For example, the filler 190 may include an acryl or silicon based organic adhesive material. The filler 190 may have an elastic rate of 400% or more.

The flexible film may be attached onto the open portion OP through a laminating process using an adhesive instead of the filler 190. However, because the laminating process of a flexible film needs an alignment device for accurate alignment, productivity may be deteriorated. Also, a void may be generated between the flexible film attached to the open portion OP and the etching surfaces 111c and 112c of the glass supporting member 110, and reliability of the flexible display panel 100 may be deteriorated due to water or oxygen permeation through the void.

The panel driving circuit 200 is connected with the display pad portion DPP of the flexible display panel 100 and supplies a signal for displaying an image on the display portion 150 to the display pad portion DPP. The panel driving circuit 200 according to one example embodiment may include a flexible circuit film 210 and a driving integrated circuit 230.

The flexible circuit film 210 may be attached to the display pad portion DPP through a film attachment process. The driving integrated circuit 230 is packaged in the flexible circuit film 210 by a chip bonding process or a surface packaging process. The driving integrated circuit 230 generates a data signal and a gate control signal based on a timing synchronizing signal and image data supplied from an external display driving system, supplies the data signal to the data line of each pixel through the pad portion, and supplies the gate control signal to the gate driving circuit portion.

Optionally, the driving integrated circuit 230 may electrically be connected to the display pad portion DPP and electrically connected to each of the pixel driving signal line and the gate driving circuit portion provided in the display portion 150 without being packaged in the flexible circuit film 210. The flexible circuit film 210 serves to relay signal transmission between the pad portion and the display driving system.

The flexible display apparatus 10 may include the glass supporting member 110 supporting the other flat display areas A1 and A2, except the bending display area A3 and the open portion OP overlapped with the bending display area A3 of the flexible display panel 100. Therefore, reliability for water or oxygen may be improved by the glass supporting member 110, and bending stress applied to the bending display area A3 of the flexible display panel 100 may be reduced due to the open portion OP, whereby bending reliability may be improved.

Also, as the flexible display apparatus 10 according to one example embodiment may include the flexible substrate 130 arranged in only the step difference portions 111b and 112b of the glass supporting member 110 overlapped with the bending display area A3 of the flexible display panel 100, material consumption of the flexible substrate may be reduced. To this end, production cost may be reduced. As the flexible display apparatus 10 according to one example embodiment further includes the filler 190 filled in the open portion OP of the glass supporting member 110, bending reliability deterioration of the flexible display panel 100 may be reduced, minimized, or avoided, and at the same time reliability for water or oxygen may be more improved.

Consequently, the flexible display apparatus 10 according to one example embodiment may be manufactured even without the laser release process, and reliability for water or oxygen and bending reliability may be improved. The laser release process for detaching the entire glass substrate 110 from the flexible substrate 130, a rear protective film attached to the rear surface of the flexible substrate 130, and an attachment process of the rear protective film may be omitted, whereby productivity may be increased.

Figure 3:
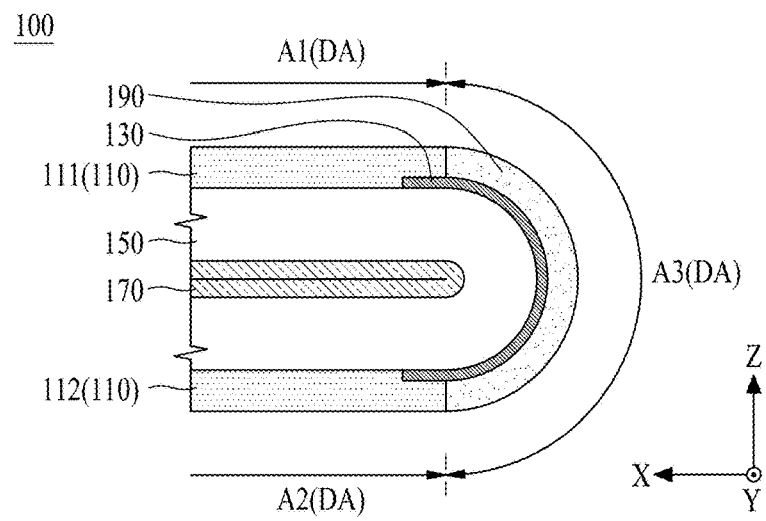
FIG. 3 illustrates an inner bending structure of a flexible display panel according to one example embodiment.

FIG. 3 illustrates an inner bending structure of a flexible display panel according to one example embodiment. Referring to FIG. 3 together with FIG. 1, the flexible display panel 100 according to one example embodiment may be folded in an inner bending manner in which the first flat display area A1 and the second flat display area A2 face each other. The flexible display panel 100 unfolded in a plane state may be folded in a direction where the first flat display area A1 and the second flat display area A2 directly face each other, in accordance with bending of the bending display area A3. The glass supporting member 110 may be arranged at the outermost of the flexible display panel 100 that is folded, whereby the display portion (or screen) may not be exposed to the outside and therefore the display portion 150 of the flexible display panel 100 may be protected from external impact by the glass supporting member 110.

Figure 4:
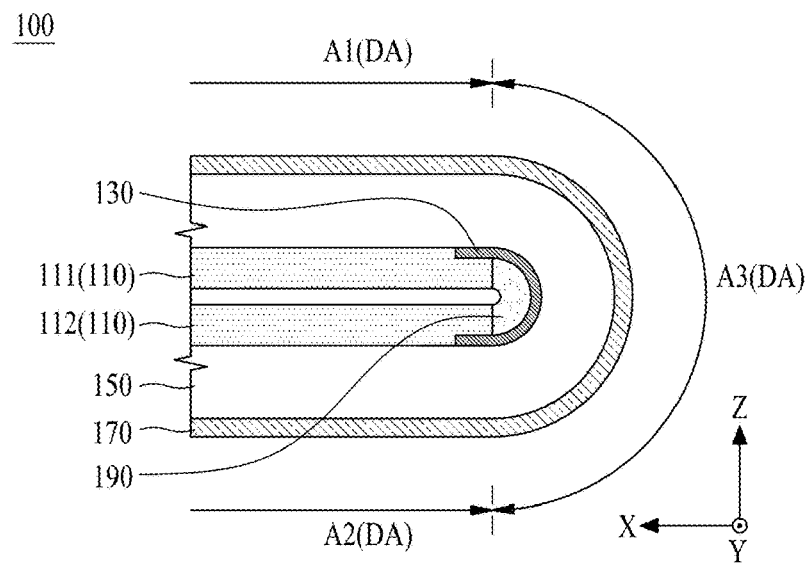
FIG. 4 illustrates an outer bending structure of a flexible display panel according to one example embodiment.

FIG. 4 illustrates an outer bending structure of a flexible display panel according to one example embodiment. Referring to FIG. 4 together with FIG. 1, the flexible display panel 100 according to one example embodiment may be folded in an outer bending manner in which the first flat display area A1 and the second flat display area A2 do not face each other. The flexible display panel 100 unfolded in a plane state may be folded in a direction where the first flat display area A1 and the second flat display area A2 do not face each other. The first supporting portion 111 and the second supporting portion 112 of the glass supporting member 110 face each other in accordance with bending of the bending display area A3. The cover film 170 may be arranged at the outermost of the flexible display panel 100 that is folded, whereby the display portion (or screen) may be exposed to the outside and therefore the flexible display panel 100 may display an image on the display portion 150 even in a state that it is folded.

Figure 5A:
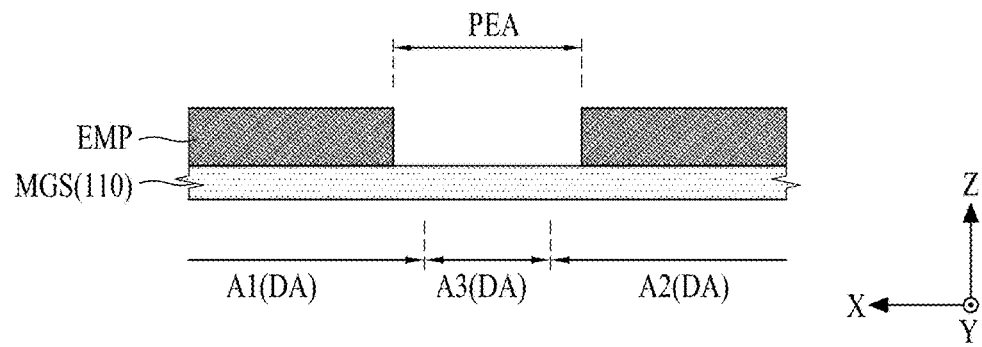
FIGS. 5A to 5C are cross-sectional views illustrating a manufacturing method of a flexible substrate illustrated in FIGS. 1 and 2.
Figure 5B:
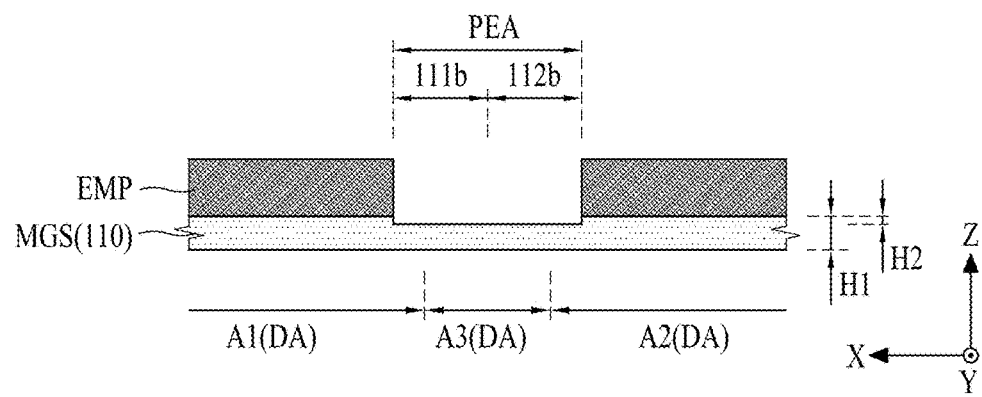
Figure 5C:
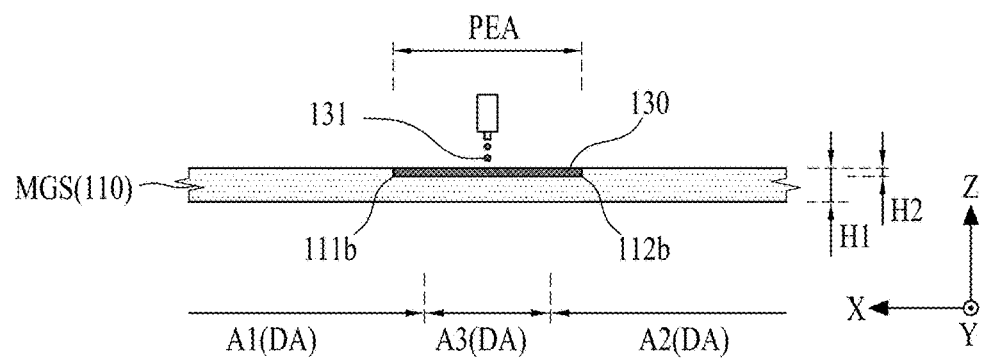

FIGS. 5A to 5C are cross-sectional views illustrating a manufacturing method of a flexible substrate illustrated in FIGS. 1 and 2. The manufacturing method of the flexible substrate according to one example embodiment will be described with reference to FIGS. 5A to 5C. First of all, as illustrated in FIG. 5A, a glass etching mask pattern EMP is formed on the other mother glass substrate MGS except a partial etching area PEA of each of a plurality of panel areas defined in the mother glass substrate MGS. The partial etching area PEA is overlapped with the bending display area A3 of the display portion to be formed in each panel area of the mother glass substrate MGS. The glass etching mask pattern EMP according to one example embodiment may be formed by a photolithography process using a photoresist.

Next, as illustrated in FIG. 5B, the partial etching area PEA of the mother glass substrate MGS is removed by partial etching through a glass etching process using the glass etching mask pattern EMP as a mask to form the step difference portions 111b and 112b of the glass supporting member 110. For example, the step difference portions 111b and 112b of the glass supporting member 110 may have a height H2 (or depth) corresponding to a half or less of the entire height H1 (or thickness) of the mother glass substrate MGS.

Next, the glass etching mask pattern EMP formed on the mother glass substrate MGS is removed (or developed). Next, as illustrated in FIG. 5C, a flexible substrate material 131 is deposited on the step difference portions 111b and 112b of the glass supporting member 110 provided in the mother glass substrate MGS and then hardened to form the flexible substrate 130. The flexible substrate material 131 according to one example embodiment may be formed by a dispensing process for depositing a liquid plastic organic material or a liquid polyimide material on the step difference portions 111b and 112b of the glass supporting member 110 and a sintering process of the deposited material. The flexible substrate material 131 may be deposited on only the step difference portions 111b and 112b partially formed in each panel area of the mother glass substrate MGS. Then, the flexible substrate material 131 may be hardened to form the flexible substrate 130, whereby material consumption of the flexible substrate 130 may be reduced. Therefore, the production cost of the flexible display apparatus may be reduced.

Figure 6A:
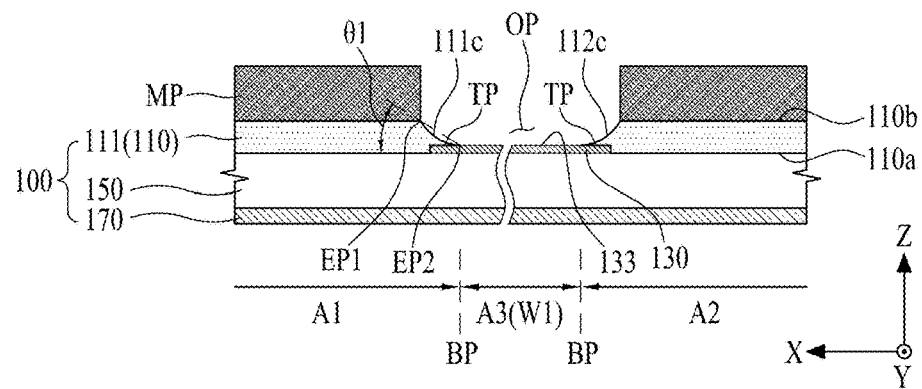
FIGS. 6A to 6C are cross-sectional views illustrating a manufacturing method of an open portion in a flexible display panel according to another example embodiment.
Figure 6B:
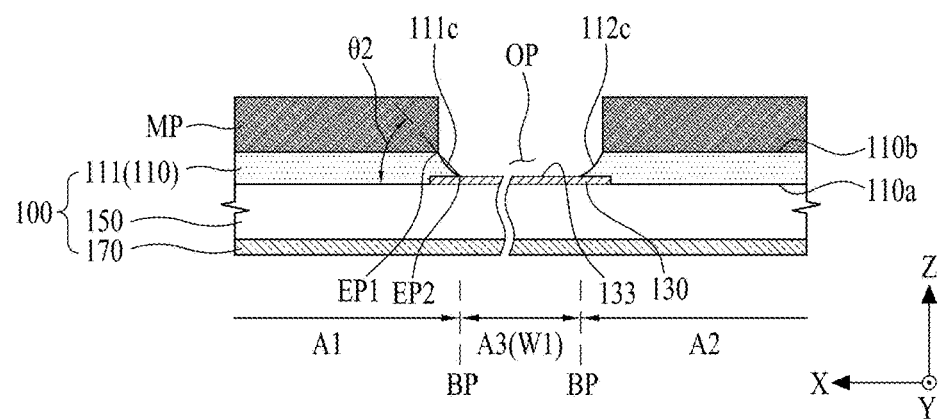
Figure 6C:
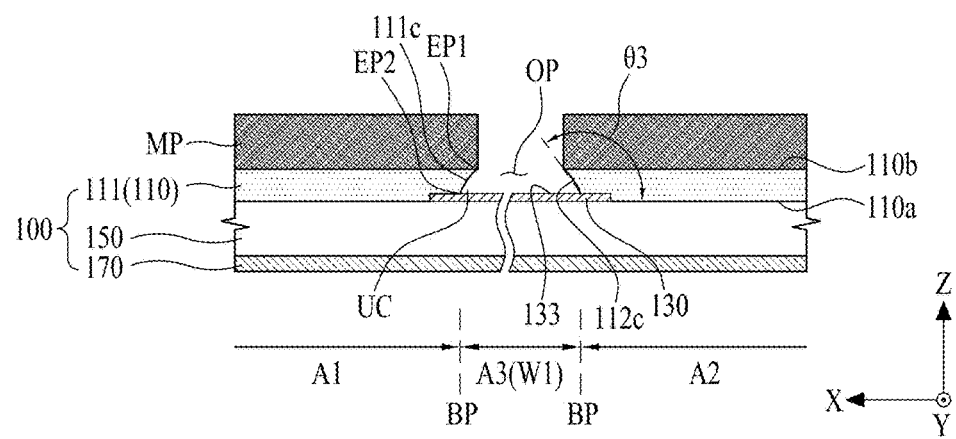

FIGS. 6A to 6C are cross-sectional views illustrating a manufacturing method of an open portion in a flexible display panel according to another example embodiment. As illustrated in FIG. 6A, the open portion OP according to the first example embodiment may be formed by a second glass etching process according to a soft etching condition. The soft etching condition may be defined by a glass etching process performed for a time less than a reference etching time set to etch a glass of a certain thickness.

The open portion OP according to the first example embodiment may expose a rear surface 133 of the flexible substrate 130 as the glass supporting member 110 overlapped with the bending display area A3 is fully removed by the second glass etching process according to the soft etching condition using a mask pattern MP formed on a rear surface 110b of the glass supporting member 110 (or the mother glass substrate) overlapped with the other flat display areas A1 and A2 except the bending display area A3 as a mask. As the rear surface 133 of the flexible substrate 130 is exposed by the open portion OP according to one example embodiment, the glass supporting member 110 is divided into a first supporting portion 111 and a second supporting portion 112 that are parallel with each other by interposing the open portion OP therebetween. Each of the first glass etching surface 111c of the first supporting portion 111 and the second etching surface 112c of the second supporting portion 112 may have a forward tapered structure having a recessed curved shape by the second etching process according to the soft etching condition.

One end EP1 of each of the first glass etching surface 111c and the second etching surface 112c may be arranged on a rear surface 100b of the glass supporting member 110 and overlapped or not with the flexible substrate 130 in accordance with the depth (or height) of the open portion OP. The other end EP2 of each of the first glass etching surface 111c and the second etching surface 112c may be arranged on a boundary portion BP of the flat display areas A1 and A2 and the bending display area A3 while being in contact with the rear surface 133 of the flexible substrate 130. A first angle θ1 between a virtual line passing through one end EP1 and the other end EP2 of each of the first glass etching surface 111c and the second glass etching surface 112c and a front surface 100a of the glass supporting member 110 may be an acute angle, for example, less than 15°.

Each of the first glass etching surface 111c and the second etching surface 112c according to the open portion OP according to the first example embodiment is formed by the second glass etching process based on the soft etching condition and therefore may include a tail portion TP overlapped with the bending display area A3. The tail portion TP may be defined as a non-etching portion where the glass supporting member 110 adjacent to the boundary portion BP between the bending display area A3 and the flat display areas A1 and A2 partially remains thin and longitudinal without being fully removed as an etching process time.

The tail portion TP of each of the first glass etching surface 111c and the second etching surface 112c, which is formed by the open portion OP, is broken when the bending display area A3 is bent or folded, whereby a particle defect is caused or a scratch or crack is formed in the flexible substrate 130. Also, the first width W1 of the open portion OP may be set to a shortest distance between the first glass etching surface 111c and the second glass etching surface 112, and a distance between the other end EP2 of the first glass etching surface 111c and the other end EP2 of the second glass etching surface 112c. The glass etching process according to the soft etching condition has a difficulty in forming the open portion OP at the first width W1 due to occurrence of the tail portion TP.

As illustrated in FIG. 6B, the open portion OP according to the second example embodiment may be formed by the second glass etching process based on a just etch condition. The just etch condition may be defined by a glass etching process performed for a predetermined reference etching time to etch a glass of a certain thickness. The open portion OP according to the second example embodiment may be formed as the glass supporting member 110 overlapped with the bending display area A3. This may occur as the glass supporting member 110 is fully removed by the second glass etching process based on the just etch condition using the mask pattern MP formed on the rear surface 110b of the glass supporting member 100 (or mother glass substrate) overlapped with the other flat display areas A1 and A2 except the bending display area A3 as a mask. Therefore, the open portion OP exposes the rear surface 133 of the flexible substrate 130.

As the rear surface 133 of the flexible substrate 130 is exposed by the open portion OP according to the second example embodiment, the glass supporting member 110 is divided into the first supporting portion 111 and the second supporting portion 112, which are parallel with each other by interposing the open portion OP therebetween. Each of the first glass etching surface 111c of the first supporting portion 111 and the second etching surface 112c of the second supporting portion 112, which are formed by the open portion OP, may have a forward tapered structure having a recessed curved shape by the second glass etching process based on the just etch condition.

One end EP1 of each of the first glass etching surface 111c and the second etching surface 112c may be arranged on the rear surface 100b of the glass supporting member 110 and overlapped or not with the flexible substrate 130 in accordance with the depth (or height) of the open portion OP. The other end EP2 of each of the first glass etching surface 111c and the second etching surface 112c may be arranged on the boundary portion BP of the flat display areas A1 and A2 and the bending display area A3 while being in contact with the rear surface 133 of the flexible substrate 130. A second angle θ2 between a virtual line passing through one end EP1 and the other end EP2 of each of the first glass etching surface 111c and the second glass etching surface 112c and the front surface 100a of the glass supporting member 110 may be an acute angle, for example, 15° to 70°.

Each of the first glass etching surface 111c and the second etching surface 112c according to the open portion OP according to the second example embodiment may be formed by the second glass etching process based on the just etch condition. Therefore, each of the first glass etching surface 111c and the second etching surface 112c may include a recessed curved shape between one end EP1 and the other end EP2 without the tail portion TP illustrated in FIG. 5A. Each of the first glass etching surface 111c and the second etching surface 112c, which are formed by the open portion OP, may be formed in a forward tapered structure having an acute angle, and a gradient of 15° to 70° from the rear surface 133 of the flexible substrate 130. Therefore, the flexible display panel 100 may be more suitable for an inner bending structure than an outer bending structure. Also, the glass etching condition based on the just etch condition may form the open portion OP having a first width W1 more easily than the soft etch condition by means of a forward tapered structure in which the tail portion TP is not generated.

For example, when the flexible display panel 100 is bent in an inner bending structure, because the glass etching surfaces 111c and 112c according to the open portion OP of the second example embodiment are not directly in contact with the bending display area A3, relatively less bending stress (or low pressure) may be applied to the glass etching surfaces 111c and 112c. On the other hand, when the flexible display panel 100 is bent in an outer bending structure, because the glass etching surfaces 111c and 112c according to the open portion OP of the second example embodiment are directly in contact with the bending display area A3, relatively more bending stress (or high pressure) may be applied to the glass etching surfaces 111c and 112c.

Therefore, relatively less bending stress may be applied to the other end EP2 of the glass etching surfaces 111c and 112c when the bending display area A3 is bent in the inner bending structure, whereby the glass etching surfaces may not be broken or damaged. However, relatively more bending stress may be applied to the other end EP2 of the glass etching surfaces 111c and 112c when the bending display area A3 is bent in the outer bending structure, whereby the glass etching surfaces may be broken or damaged. Therefore, the open portion OP according to the second example embodiment is applied to the flexible display panel 100 folded or bent in the inner bending structure.

As illustrated in FIG. 6C, the open portion OP according to the third example embodiment may be formed by the second etching process based on an over etch condition. The over etch condition may be defined by a glass etching process performed by exceeding the reference etching time set to etch a glass of a certain thickness.

The open portion OP according to the third example embodiment may be formed as the glass supporting member 110 overlapped with the bending display area A3 is fully removed by the second glass etching process based on the over etch condition using the mask pattern MP formed on the rear surface 110b of the glass supporting member 100 (or mother glass substrate) overlapped with the other flat display areas A1 and A2 except the bending display area A3 as a mask. Therefore, the open portion OP may expose the rear surface 133 of the flexible substrate 130. As the rear surface 133 of the flexible substrate 130 is exposed by the open portion OP according to the third example embodiment, the glass supporting member 110 is divided into the first supporting portion 111 and the second supporting portion 112, which are parallel with each other by interposing the open portion OP therebetween. Each of the first glass etching surface 111c of the first supporting portion 111 and the second etching surface 112c of the second supporting portion 112 may have an inverse tapered structure having a recessed curved shape by the second glass etching process based on the over etch condition.

One end EP1 of each of the first glass etching surface 111c and the second etching surface 112c may be arranged on the rear surface 110b of the glass supporting member 110 and overlapped with the flexible substrate 130. The other end EP2 of each of the first glass etching surface 111c and the second glass etching surface 112c may be arranged on the boundary portion BP of the flat display areas A1 and A2, and the bending display area A3, while in contact with the rear surface 133 of the flexible substrate 130. The other end EP2 of each of the first glass etching surface 111c and the second etching surface 112c may be arranged closer to the edge area of the flexible substrate 130 than one end EP1. A third angle θ3 between a virtual line passing through one end EP1 and the other end EP2 of each of the first glass etching surface 111c and the second glass etching surface 112c and the front surface 110a of the glass supporting member 110 may be an abuse angle, for example, 105° to 145°.

Each of the first glass etching surface 111c and the second glass etching surface 112c may include an undercut UC formed near the boundary surface with the rear surface 133 of the flexible substrate 130. The undercut UC may be formed as the front surface of the glass supporting member 110 adjacent to the rear surface 133 of the flexible substrate 130 overlapped with the boundary portion BP between the bending display area A3 and the flat display areas A1 and A2 is more etched (or over-etched) by the etching process time exceeding the reference etching time.

Each of the first glass etching surface 111c and the second etching surface 112c according to the open portion OP according to the third example embodiment may be formed by the second glass etching process based on the over etch condition. Therefore, each of the first glass etching surface 111c and the second glass etching surface 112c may include a recessed curved shape having an undercut UC between one end EP1 and the other end EP2 without the tail portion TP illustrated in FIG. 6A. Each of the first glass etching surface 111c and the second glass etching surface 112c may have an abuse angle, and a gradient of 105° to 145° from the rear surface 133 of the flexible substrate 130. Therefore, the flexible display panel 100 may be applied to the inner bending structure or the outer bending structure but may be more suitable for the outer bending structure. Also, the glass etching condition based on the over etch condition may form the open portion OP having a first width W1 more easily than the soft etch condition by means of an inverse tapered structure having an undercut UC.

For example, when the flexible display panel 100 is bent in an inner bending structure, because the glass etching surfaces 111c and 112c according to the open portion OP of the third example embodiment are not directly in contact with the bending display area A3, relatively less bending stress (or low pressure) may be applied to the glass etching surfaces 111c and 112c by the bending display area A3 bent in the inner bending structure. Therefore, the glass etching surfaces 111c and 112c according to the open portion OP of the third example embodiment may be applied to the flexible display panel 100 folded or bent in the inner bending structure.

When the flexible display panel 100 is bent in an outer bending structure, because the glass etching surfaces 111c and 112c according to the open portion OP of the third example embodiment may guide outer bending of the being display area A3 and have an inclined or recessed shape. Therefore, even though the bending display area A3 is bent in the outer bending structure, relatively less bending stress may be applied to the glass etching surfaces 111c and 112c, whereby the glass etching surfaces 111c and 112c are not broken or damaged.

Therefore, the glass etching surfaces 111c and 112c according to the open portion OP of the third example embodiment may be applied to the flexible display panel 100 folded or bent in the outer bending structure. Particularly, because the glass etching surfaces 111c and 112c according to the open portion OP of the third example embodiment may guide the outer bending of the bending display area A3, the glass etching surfaces 111c and 112c are applied to the flexible display panel 100 folded or bent in the outer bending structure.

Figure 7:
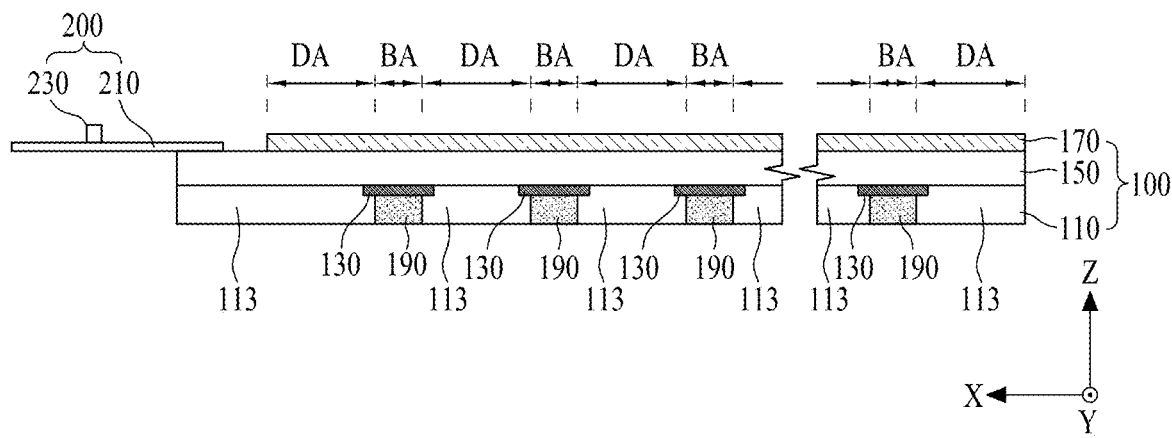
FIG. 7 is a cross-sectional view illustrating a flexible display apparatus according to another example embodiment.

FIG. 7 is a cross-sectional view illustrating a flexible display apparatus according to another example embodiment. In the flexible display apparatus according to another example embodiment, an open portion is provided between two or more supporting portions and two or more supporting portions of the glass supporting member of the flexible display panel in the flexible display apparatus according to one example embodiment illustrated in FIGS. 1 to 6C. Therefore, the supporting portion of the glass supporting member and the open portion and their related elements will be described, and repeated description of the other elements will be omitted.

As illustrated in FIG. 7, a flexible display apparatus 30 according to another example embodiment may include a flexible display panel 100 applicable to a rollable display apparatus. The flexible display panel 100 may be configured such that at least a bending area BA defined on a display area DA at a certain interval is bent in a curved shape. The flexible display panel 100 may include a plurality of display areas DA and bending areas BA among the plurality of display areas DA. The plurality of display areas DA and the plurality of bending areas BA embody one screen where images of one frame are continuously displayed without disconnection. A width of each of the plurality of display areas DA and a width of each of the plurality of bending areas BA may be set in accordance with a curvature radius of the flexible display panel 100 wound in a spiral shape.

In the flexible display apparatus 30 according to another example embodiment, the glass supporting member 110 may include a plurality of supporting portions 113. Each of the plurality of supporting portions 113 may have a step difference portion overlapped with each of the plurality of bending areas BA, a plurality of flexible substrates 130 arranged between adjacent supporting portions 113, and a plurality of open portions arranged among the plurality of supporting portions 113 while being overlapped with the respective bending areas BA. The plurality of supporting portions 113 are respectively spaced apart from each other by the open portions to have a certain interval. Because each of the plurality of supporting portions 113 includes a plane portion, a step difference portion, and a glass etching surface, which are the same as described above, repeated description thereof will be omitted. The plurality of supporting portions 113 support edge areas of each of the plurality of display areas DA and each of the plurality of flexible substrates 130 in a plane state.

Figure 8A:
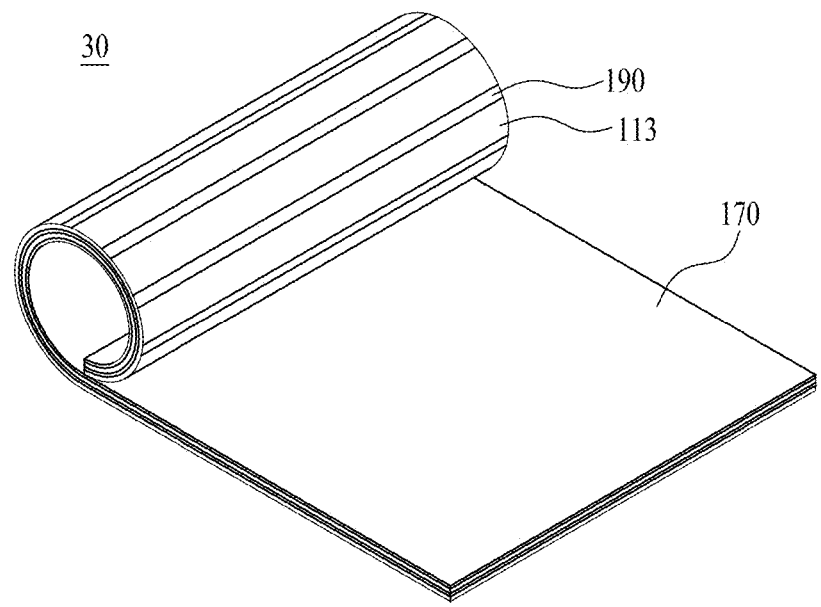
FIG. 8A illustrates an inner winding structure of a flexible display apparatus according to another example embodiment.
Figure 8B:
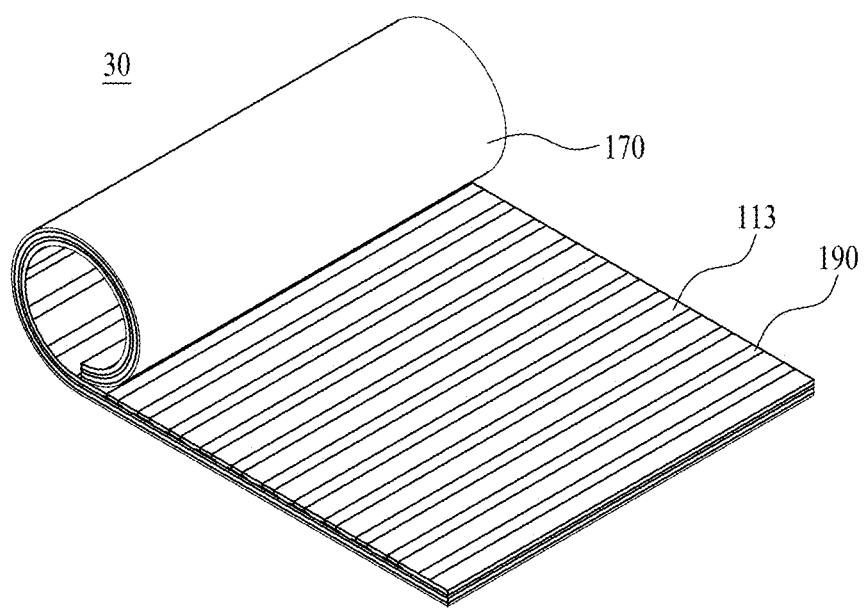
FIG. 8B illustrates an outer winding structure of a flexible display apparatus according to another example embodiment.

Each of the plurality of flexible substrates 130 is arranged between the step difference portions of the adjacent supporting portions 113 as described above, and therefore repeated description thereof will be omitted. Each of the plurality of open portions is formed in the glass supporting member 110 overlapped with each of the plurality of bending areas BA to expose the rear surface of each of the plurality of flexible substrates 130, thereby enabling bending of the flexible substrate 130. These open portions may be formed by the glass etching process based on the just etch condition or the over etch condition as described above. The flexible display apparatus 30 according to another example embodiment may further include a filler 190 filled (or buried) in each of the plurality of open portions for exposing the rear surface of each of the plurality of flexible substrates 130. Because the filler 190 is the same as the aforementioned filler, its repeated description will be omitted. The flexible display apparatus 30 according to another example embodiment may be wound in a spiral shape in accordance with an inner winding structure based on the inner bending structure of the flexible display panel 100 as illustrated in FIG. 8A. The flexible display apparatus 30 according to another example embodiment may be wound in a spiral shape in accordance with an outer winding structure based on the outer bending structure of the flexible display panel 100 as illustrated in FIG. 8B.

Figure 9A:
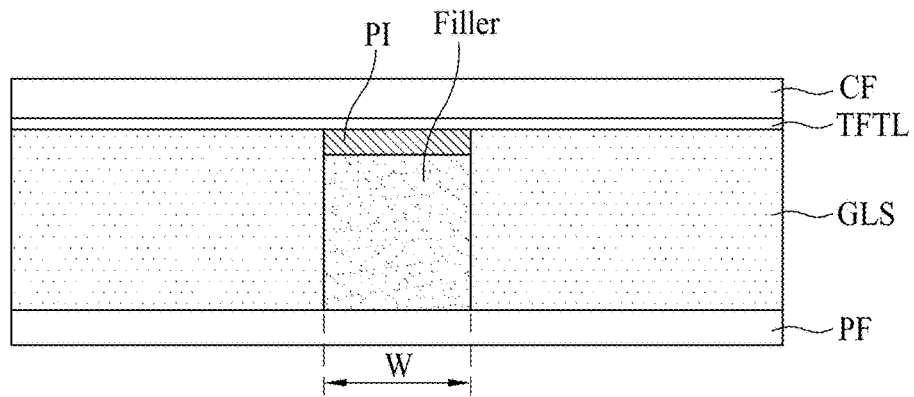
FIGS. 9A to 9C are cross-sectional views illustrating a flexible display panel according to first to third experimental examples.
Figure 9B:
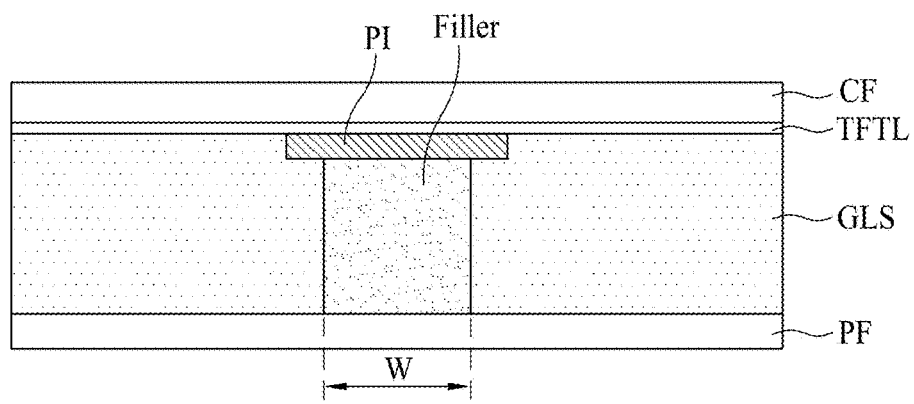
Figure 9C:
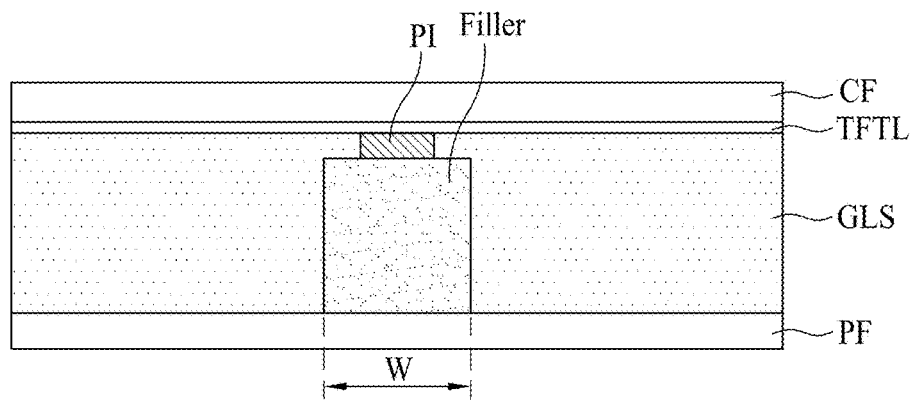

FIGS. 9A to 9C are cross-sectional views illustrating a flexible display panel according to first to third experimental examples, in which a width of a flexible substrate is variably provided. The flexible substrate PI according to the first experimental example, as illustrated in FIG. 9A, may have the same width as a width W of the filler. The flexible substrate PI according to the second experimental example, as illustrated in FIG. 9B, may have a width wider than the width W of the filler as much as 1.5 times. The flexible substrate PI according to the third experimental example, as illustrated in FIG. 9C, may have a width narrower than the width W of the filler as much as 1.5 times. In the first to third experimental examples, a thin film transistor layer TFTL including a thin film transistor is arranged on a front surface of the glass substrate GLS and the flexible substrate PI, and a cover film CF of a plastic material is arranged on the thin film transistor layer TFTL. A protective film PF of a plastic material is arranged on a rear surface of the glass substrate GLS and the flexible substrate PI.

Figure 10A:
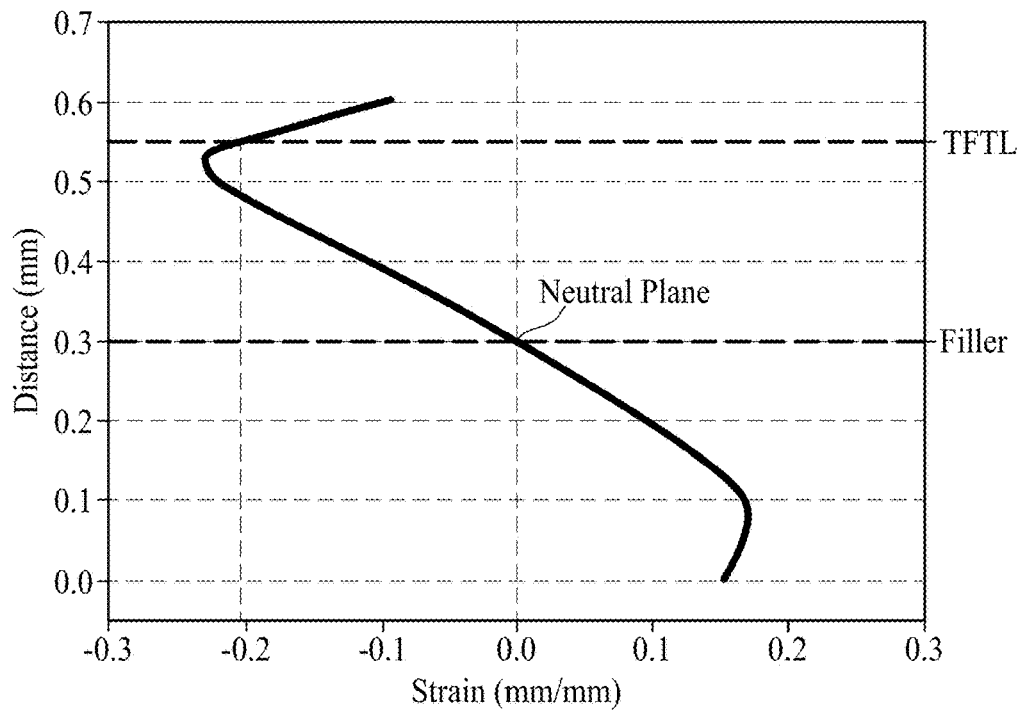
FIGS. 10A to 10C are graphs illustrating a strain applied to a thin film transistor in accordance with a width ratio between a flexible substrate and a filler illustrated in FIG. 2.
Figure 10B:
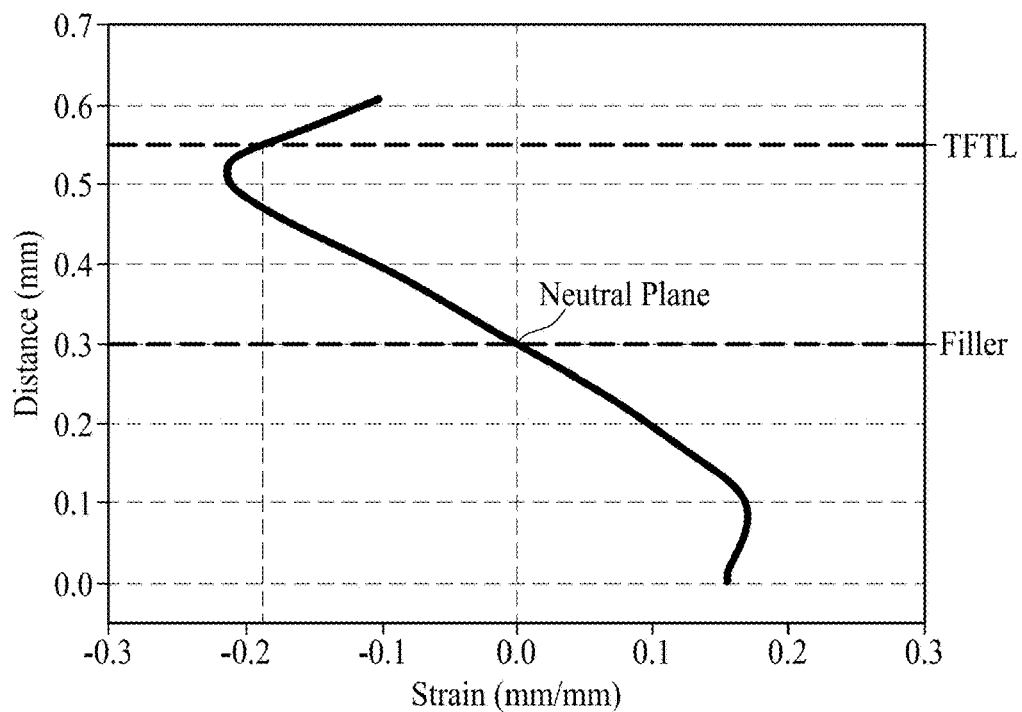
Figure 10C:
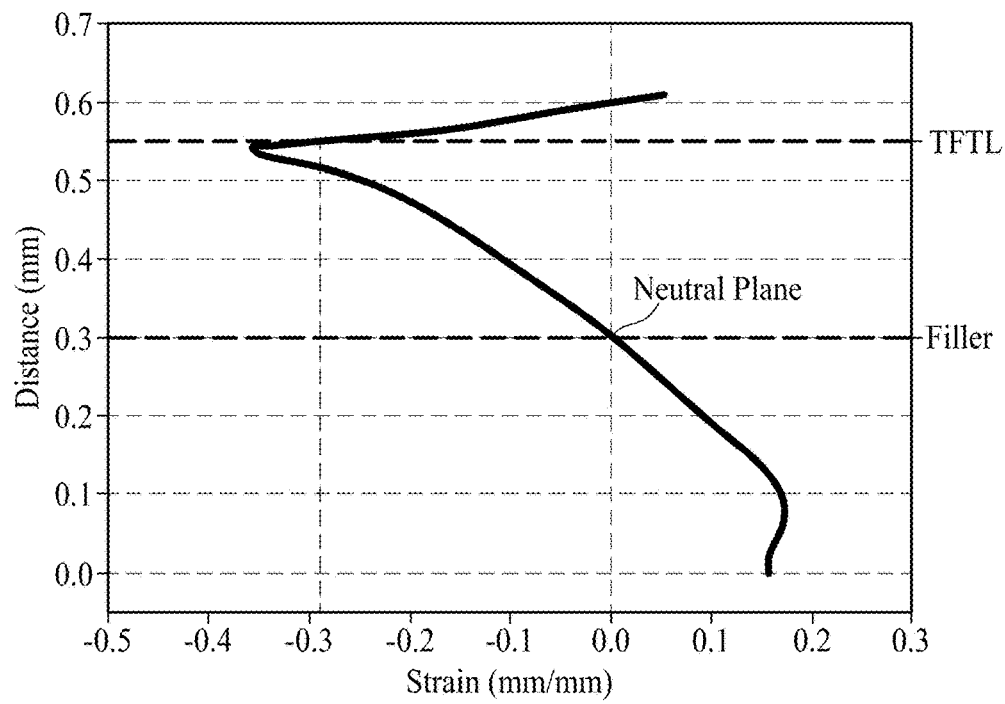

FIGS. 10A to 10C are graphs illustrating a strain applied to a thin film transistor during outer bending of a flexible display panel according to first to third experimental examples. In FIGS. 10A to 10C, Y-axis denotes a distance from the protective film PF attached to a lower surface of the glass substrate GLS, and X-axis denotes a strain. In case of the X-axis, a positive (+) strain value denotes a level of tensile stress, and a negative (−) strain value denotes a level of compressive stress.

As illustrated in FIGS. 9A and 10A, a neutral plane where a compressive stress value and a tensile stress value become zero may be arranged in the filler when the flexible display panel according to the first experimental example is bent in accordance with the outer bending manner, and a strain (or compressive stress) of about −0.2 is applied to the thin film transistor layer TFTL. As illustrated in FIGS. 9B and 10B, the neutral plane is arranged in the filler when the flexible display panel according to the second experimental example is bent in accordance with the outer bending manner, and a strain (or compressive stress) of about −0.19 is applied to the thin film transistor layer TFTL. As illustrated in FIGS. 9C and 10C, the neutral plane is arranged in the filler when the flexible display panel according to the third experimental example is bent in accordance with the outer bending manner, and a strain (or compressive stress) of about −0.29 is applied to the thin film transistor layer TFTL.

The strain applied to the thin film transistor layer TFTL during bending of the flexible substrate PI is reduced when the width of the flexible substrate PI is wider than the width W of the filler as much as 1.5 times. Therefore, the strain applied to the thin film transistor layer TFTL is reduced if the width of the flexible substrate PI is wider than that of the filler. As a result, the flexible substrate may have a width wider than that of the filler, and a width of the bending display area as much as 1.5 times.

Figure 11:
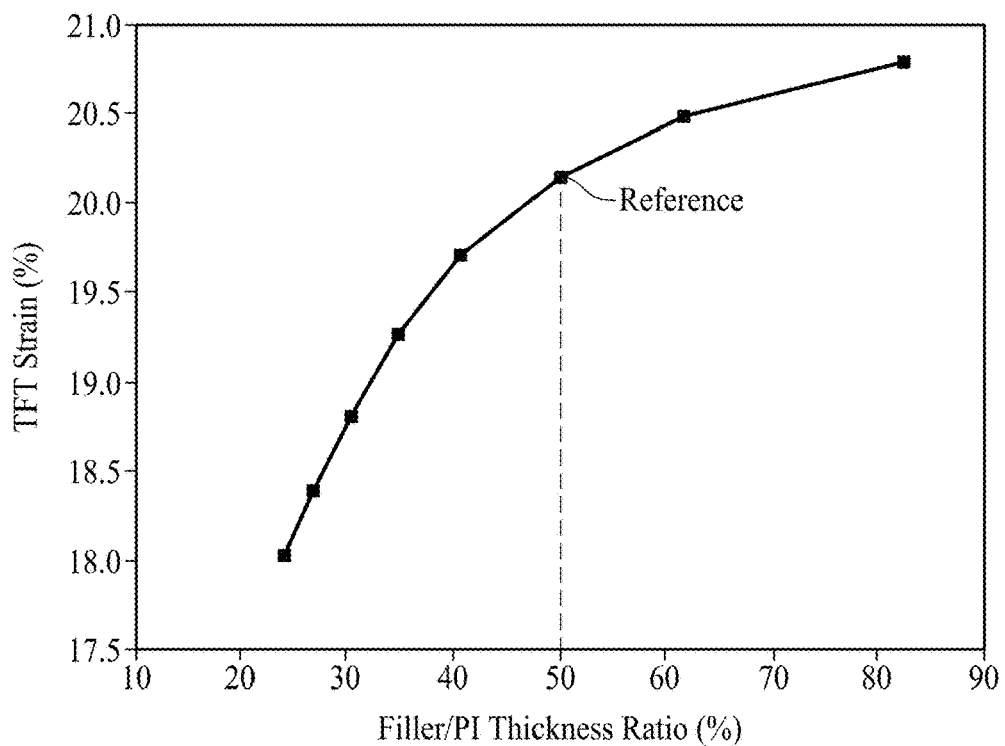
FIG. 11 is a graph illustrating a strain applied to a thin film transistor in accordance with a thickness ratio of a flexible substrate to a thickness of a filler illustrated in FIG. 2.

FIG. 11 is a graph illustrating strain applied to a thin film transistor in accordance with a thickness ratio of a flexible substrate to a thickness of a filler illustrated in FIG. 9B. In FIG. 11, X-axis denotes a thickness ratio of the flexible substrate to the thickness of the filler, and Y-axis denotes a strain applied to the thin film transistor. In the X-axis, a thickness ratio has a low value if the thickness of the flexible substrate PI is increased. The strain applied to the thin film transistor is reduced if the thickness ratio of the flexible substrate PI to the thickness of the filler is reduced from 50% to 10%. Also, the strain applied to the thin film transistor is reduced if the thickness of the flexible substrate PI is increased. Therefore, the thickness ratio of the flexible substrate PI to the thickness of the filler may be set to 30% or less. The flexible substrate PI may have a thickness of 12 micrometers or more, and may be thinner than a half thickness of the glass supporting member.

Figure 12:
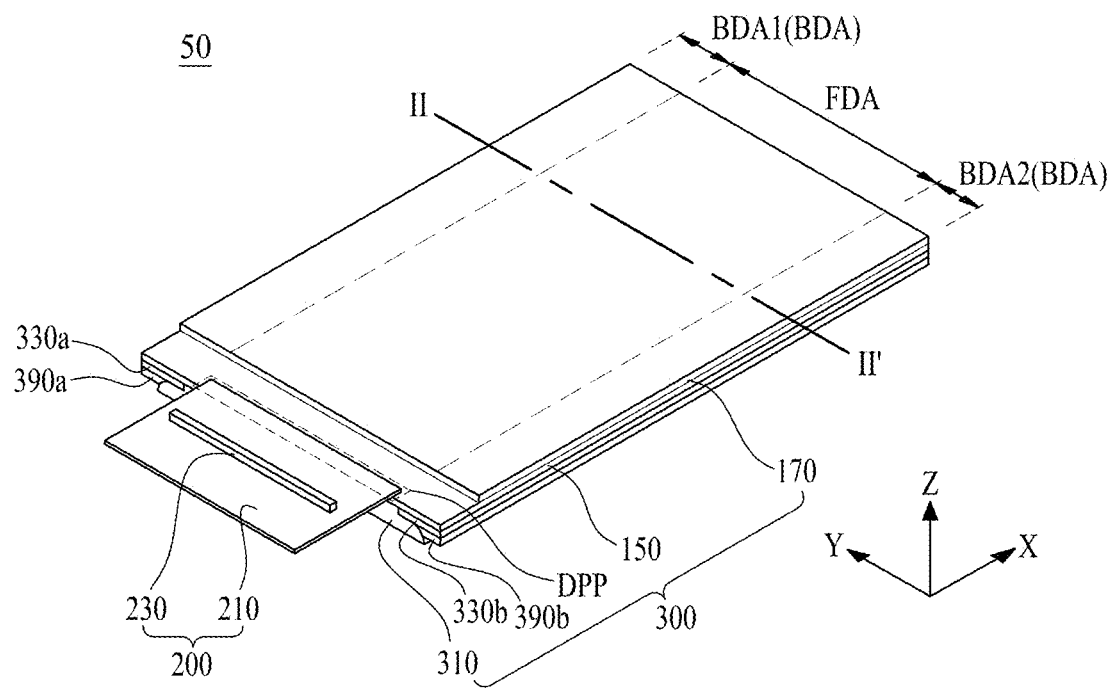
FIG. 12 illustrates a flexible display apparatus according to other example embodiment.
Figure 13:
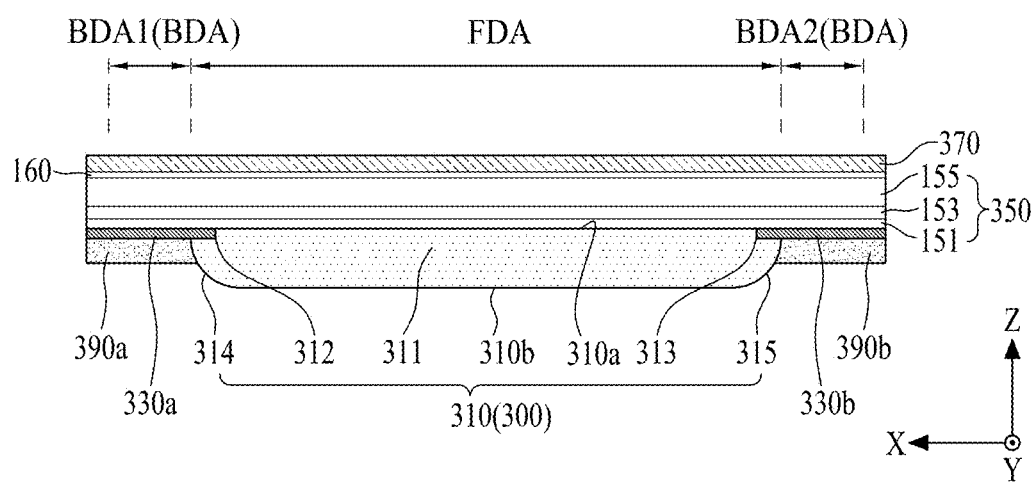
FIG. 13 is a cross-sectional view taken along line II-II' illustrated in FIG. 12.

FIG. 12 illustrates a flexible display apparatus according to other example embodiment. FIG. 13 is a cross-sectional view taken along line II-II' illustrated in FIG. 12, in which a position of the bending display area of the flexible display panel illustrated in FIGS. 1 and 2 is modified. Therefore, in the following description, repeated description of the bending display area of the flexible display panel and the other elements except elements related to the bending display area will be omitted. As illustrated in FIGS. 12 and 13, in a flexible display apparatus 50 according to other example embodiment, a flexible display panel 300 may include a flat display area FDA, a bending display area BDA, and a non-display area. The flat display area FDA may be defined as a main display portion or a center display portion, that displays an image of the other center portion except the first and second edge areas among full images displayed on the flexible display panel 300.

The bending display area BDA may be defined as an edge display portion for displaying images of the first and second edge areas continuously connected with the image displayed on the flat display area FDA without disconnection, among full images displayed on the flexible display panel 300. Optionally, the bending display area BDA may be defined as an edge display portion for displaying an edge image independent from the image displayed on the flat display area FDA.

The bending display area BDA according to one example embodiment may include a first bending display area BDA1 and a second bending display area BDA2. The first bending display area BDA1 may be extended from one side of the flat display area FDA and display an edge image continuously connected with one side of the image displayed on the flat display area FDA, among full images displayed on the flexible display panel 300. The first bending display area BDA1 may be expressed as a first edge display portion, a first curved display portion, or a first active bending display portion.

The second bending display area BDA2 may be extended from the other side of the flat display area FDA and display an edge image continuously connected with one side of the image displayed on the flat display area FDA, among full images displayed on the flexible display panel 300. The second bending display area BDA2 may be expressed as a second edge display portion, a second curved display portion, or a second active bending display portion.

The non-display portion may be defined as a bezel area arranged at the edge areas of the flexible display panel 300. The flexible display panel 300 according to one example embodiment may include a glass supporting member 310, a first flexible substrate 330a, a second flexible substrate 330b, and a display portion 350. The glass supporting member 310 is a base substrate or support substrate of the flexible display apparatus 50, and supports the first flexible substrate 330a, the second flexible substrate 330b and the display portion 350. The glass supporting member 310 may substantially be made of the same material as that of the glass supporting member 110 illustrated in FIGS. 1 and 2.

The glass supporting member 310 according to one example embodiment may include a flat portion 311, a first step difference portion 312, a second step difference portion 313, a first glass etching surface 314, and a second glass etching surface 315. The flat portion 311 is configured in a flat panel shape and supports a flat display area FDA. The flat portion 311 according to one example embodiment may have a size and a certain thickness corresponding to the flat display area FDA. The first step difference portion 312 may be arranged at an edge area of one side of the flat portion 311 to support the first flexible substrate 330a. For example, the first step difference portion 312 may be formed to be recessed at a left edge area of the flat portion 311 by the aforementioned first glass etching process for the glass supporting member 310. Because the first step difference portion 312 is similar to the first step difference portion 111b illustrated in FIG. 2 except that the first step difference portion 312 is arranged at the edge area of one side of the flat portion 311 to support the first flexible substrate 330a, its repeated description will be omitted.

The second step difference portion 313 may be arranged at an edge area of the other side of the flat portion 311 to support the second flexible substrate 330b. For example, the second step difference portion 313 may be formed to be recessed at a right edge area of the flat portion 311 by the aforementioned first glass etching process for the glass supporting member 310. Because the second step difference portion 313 is similar to the second step difference portion 112b illustrated in FIG. 2 except that the second step difference portion 313 is arranged at the edge area of the other side of the flat portion 311 to support the second flexible substrate 330b, its repeated description will be omitted.

The first glass etching surface 314 may be configured to be connected to the first step difference portion 312. The first glass etching surface 314 is formed at one side of the flat portion 311 to overlap the first bending area BDA1 to expose the edge area of the rear surface of the first flexible substrate 330a. The first glass etching surface 314 may be formed by a second glass etching process for fully removing the edge areas of the first step difference portion 312 from the mother glass substrate using an etching solution, which can melt a glass material, without using a laser scribing process. Because the first glass etching surface 314 is formed by the glass etching process not the laser scribing process, the first glass etching surface 314 may have an inclined forward tapered structure or inverse tapered structure.

The second glass etching surface 315 may be configured to be connected to the second step difference portion 313. The second glass etching surface 315 is formed at the other side of the flat portion 311 to overlap the second bending area BDA2 to expose the edge area of the rear surface of the second flexible substrate 330b. The second glass etching surface 315 may be formed by a second glass etching process for fully removing the edge areas of the second step difference portion 313 from the mother glass substrate using an etching solution, which can melt a glass material, without using a laser scribing process. Because the second glass etching surface 315 is formed by the glass etching process not the laser scribing process, the second glass etching surface 315 may have an inclined forward tapered structure or inverse tapered structure. For example, because the second glass etching surface 315 is formed by the second glass etching process simultaneously with the first glass etching surface 314, the second glass etching surface 315 may have the same forward tapered structure or inverse tapered structure as that of the first glass etching surface 314.

Because the second glass etching process for forming the first glass etching surface 314 and the second glass etching surface 315 is the same as the method for forming the open portion illustrated in FIGS. 6A to 6C, its repeated description will be omitted. The first flexible substrate 330a may be arranged on the first step difference portion 312 of the glass supporting member 310 and supports the first bending display area BDA1 to bend the first bending display area BDA1. The first flexible substrate 330a according to one example embodiment may include a plastic material to allow the first bending display area BDA1 to be bent or folded in a curved shape. For example, the first flexible substrate 330a may be made of the same material as that of the flexible substrate 130 illustrated in FIGS. 1 and 2.

The second flexible substrate 330b may be arranged on the second step difference portion 313 of the glass supporting member 310 and supports the second bending display area BDA2 to bend the second bending display area BDA2. The second flexible substrate 330b according to one example embodiment may include a plastic material to allow the second bending display area BDA2 to be bent or folded in a curved shape. For example, the second flexible substrate 330b may be made of the same material as that of the first flexible substrate 330a. The display portion 350 may be arranged on the glass supporting member 310, the first flexible substrate 330a and the second flexible substrate 330b to display images. The display portion 350 may be expressed as a pixel array portion. The display portion 350 according to one example embodiment may include a buffer layer 151, a pixel array layer 153, and an encapsulation layer 155.

The flexible display panel 300 according to one example embodiment may further include a first filler 390a and a second filler 390b. The first filler 390a may be formed on the rear surface of the first flexible substrate 330a exposed to the outside without being supported by the glass supporting member 310, and may cover the entire rear surface of the first flexible substrate 330a and partially or fully cover the first glass etching surface 314 of the glass supporting member 310. The second filler 390b may be formed on the rear surface of the second flexible substrate 330b exposed to the outside without being supported by the glass supporting member 310, and may cover the entire rear surface of the second flexible substrate 330b and partially or fully cover the second glass etching surface 315 of the glass supporting member 310. Each of the first filler 390a and the second filler 390b may be made of the same material as that of the filler 190 illustrated in FIGS. 1 and 2.

A thickness of each of the first filler 390a and the second filler 390b may be set based on a position of a neutral plane based on a compressive stress and a tensile stress applied to the bending display areas BDA1 and BDA2 during bending of the bending display areas BDA1 and BDA2 of the flexible display panel 300. When another flexible display apparatus 50 is applied to an electronic device such as a smartphone, the flexible display panel 300 may be attached to an inner side of a cover window having a three-dimensional shape of the electronic device. The bending display areas BDA1 and BDA2 of the flexible display panel 300 may be attached to a curved portion of the cover window having a three-dimensional shape, and maintained in a state bent in a curved shape having a certain curvature radius. Therefore, the thickness of each of the first filler 390a and the second filler 390b may be set to cover the entire rear surface of the flexible substrates 330a and 330b, and partially or fully cover the glass etching surfaces 314 and 315 of the glass supporting member 310. As such, the neutral plane of the bending display areas BDA1 and BDA2 maintained in a state bent in a curved shape may be arranged in the pixel circuit layer.

The flexible display panel 300 according to one example embodiment may further include a cover film 370 arranged on the encapsulation layer 155. The cover film 370 may be attached onto the encapsulation layer 155 by an adhesive member 160. Because the cover film 370 is substantially the same as the cover film 170 illustrated in FIGS. 1 and 2, its repeated description will be omitted and the same reference numerals are given to the elements of the cover film. The flexible display apparatus 50 according to other example embodiment may have substantially the same effect as that of the flexible display apparatus 10 according to one example embodiment.

Figure 14A:
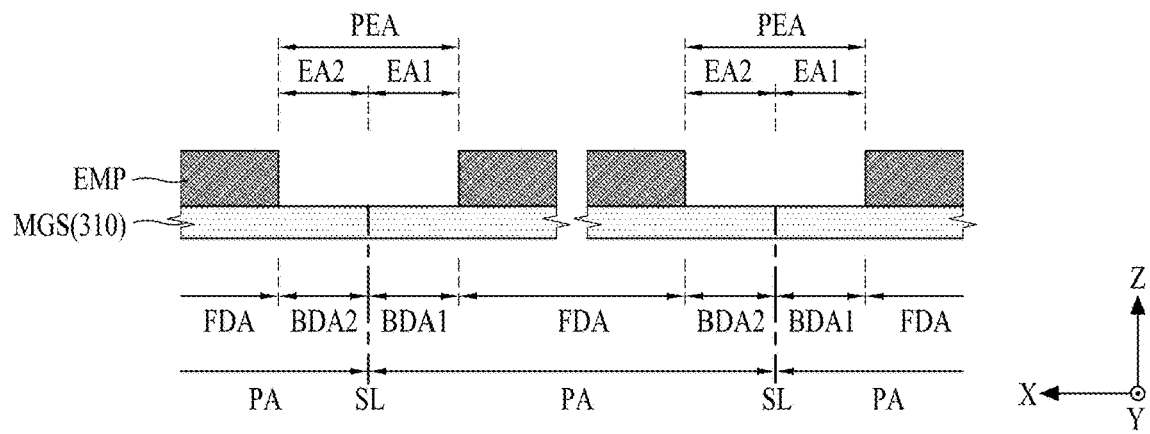
FIGS. 14A to 14C are cross-sectional views illustrating a manufacturing method of a flexible substrate illustrated in FIGS. 12 and 13.
Figure 14B:
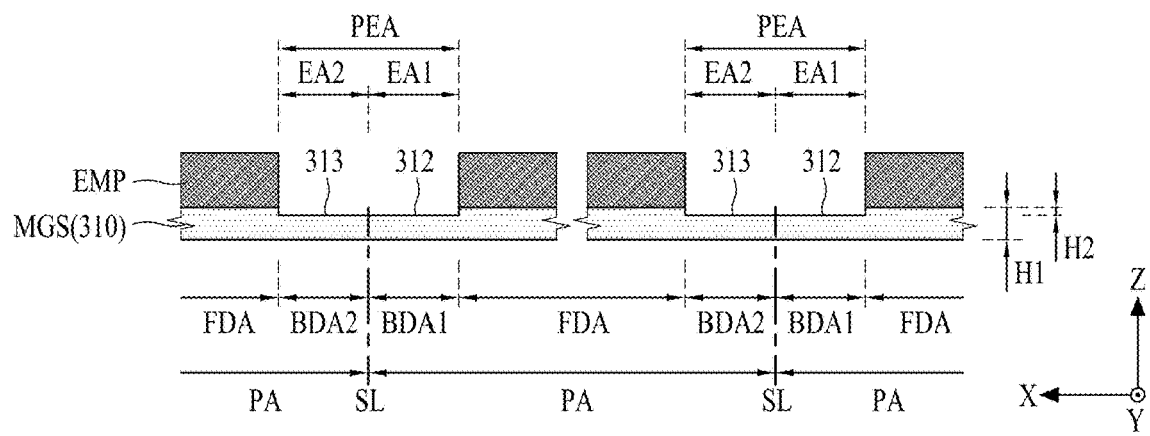
Figure 14C:
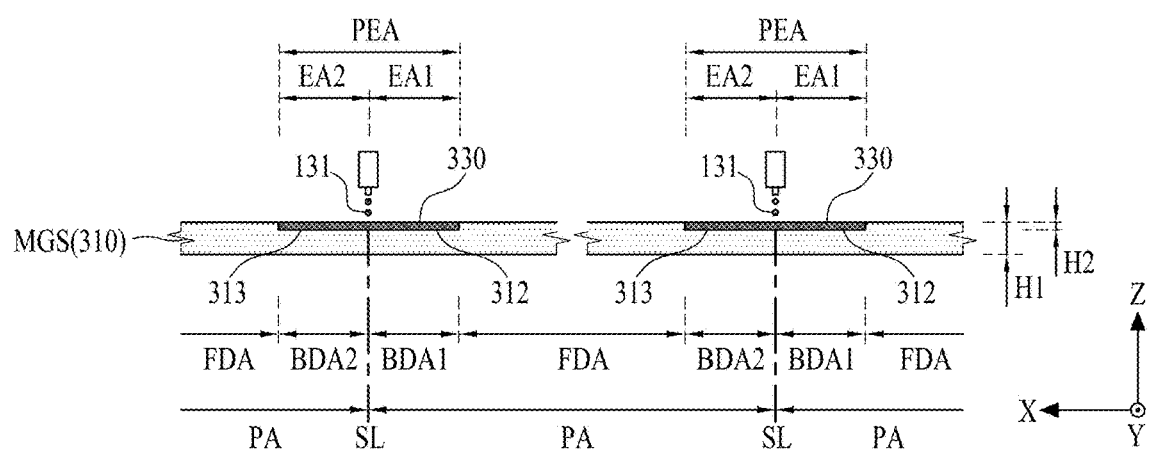

FIGS. 14A to 14C illustrate a manufacturing method of a flexible substrate illustrated in FIGS. 12 and 13. The manufacturing method of the flexible substrate in the flexible display apparatus 50 according to another example embodiment will be described with reference to FIGS. 14A to 14C. First of all, as illustrated in FIG. 14A, a glass etching mask pattern EMP is formed on the other mother glass substrate MGS except a partial etching area PEA of each of a plurality of panel areas PA defined in the mother glass substrate MGS. The partial etching area PEA may include one side edge area EA1 of each panel area PA and the other side edge area EA2 of each panel area PA based on a boundary portion (or scribing line SL) between the respective panel areas PA of the mother glass substrate MGS. The partial etching area PEA may be overlapped with the first and second bending display areas BDA1 and BDA2. The glass etching mask pattern EMP may be formed by a photolithography process using a photoresist.

Next, as illustrated in FIG. 14B, the partial etching area PEA of the mother glass substrate MGS is removed by partial etching through a glass etching process using the glass etching mask pattern EMP as a mask to form the first and second step difference portions 312 and 313 of the glass supporting member 310 at the one side edge area EA1 and the other side edge area EA2 of each panel area PA. For example, the first and second step difference portions 312 and 313 of the glass supporting member 310 may have a height H2 (or depth) corresponding to a half or less of the entire height H1 (or thickness) of the mother glass substrate MGS.

Next, the glass etching mask pattern EMP formed on the mother glass substrate MGS is removed (or developed). Next, as illustrated in FIG. 14C, a flexible substrate material 131 is deposited on the first and second step difference portions 312 and 313 of the glass supporting member 310 provided in each panel area of the mother glass substrate MGS and then hardened to form the flexible substrate 330. The flexible substrate material 131 according to one example embodiment may be formed by a dispensing process for depositing a liquid plastic organic material or a liquid polyimide material on the first and second step difference portions 312 and 313 of the glass supporting member 310 and a sintering process of the deposited material.

Next, if the manufacturing process of the flexible display panel is completed, the second glass etching process is formed for the partial etching area PEA overlapped with the flexible substrate 330 arranged between the respective panel areas PA of the mother glass substrate MGS. In this way, the glass supporting member 310 having first and second glass etching surfaces is formed on each panel area PA of the mother glass substrate MGS. Therefore, the rear surface of the flexible substrate 330 is opened as the first and second glass etching surfaces of the glass supporting member 310 are formed on each panel area PA. The flexible substrate 330 arranged between the respective panel areas PA of the mother glass substrate MGS is divided by the scribing process of the scribing line SL set between the respective panel areas PA.

The flexible substrate material 131 may be deposited on only the step difference portions 312 and 313 partially formed in each panel area PA of the mother glass substrate MGS, and then hardened to form the flexible substrate 330. The flexible substrate 330 may be divided into a first flexible substrate 330a and a second flexible substrate 330b, whereby material consumption of the flexible substrate 330 may be reduced, and therefore the production cost of the flexible display apparatus may be reduced.

Figure 15:
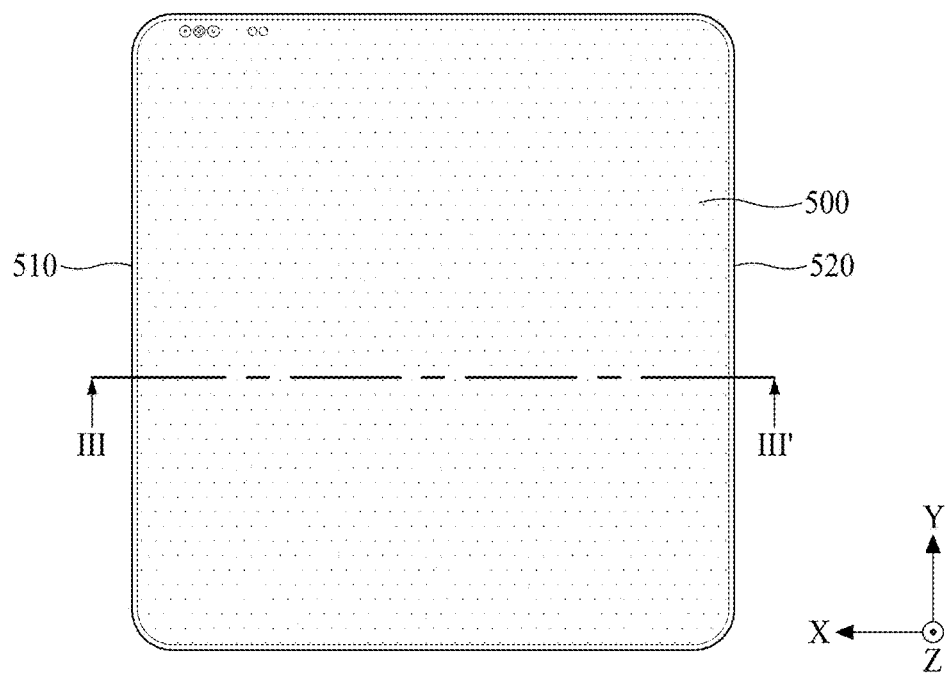
FIG. 15 illustrates an electronic device according to one example embodiment.
Figure 16:
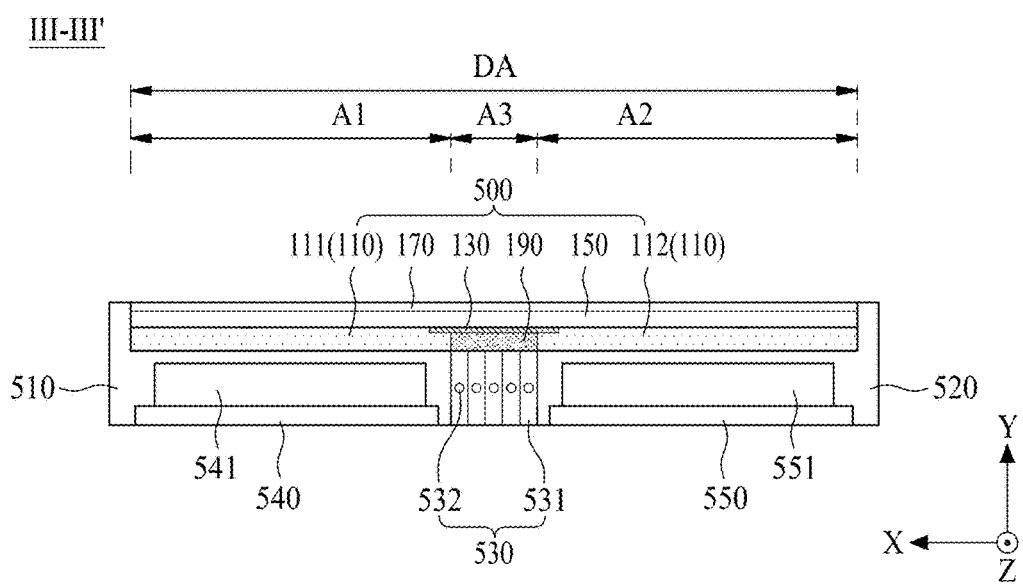
FIG. 16 is a cross-sectional view taken along line illustrated in FIG. 15.

FIG. 15 illustrates an electronic device according to one example embodiment. FIG. 16 is a cross-sectional view taken along line illustrated in FIG. 15, in which a foldable display apparatus or a foldable electronic device, which includes the flexible display apparatus illustrated in FIGS. 1 and 2, are illustrated. As illustrated in FIGS. 15 and 16, the electronic device according to one example embodiment may include a flexible display module 500, a first middle frame 510, a second middle frame 520, and a hinge portion 530.

The flexible display module 500 may be configured such that at least a portion of a screen, and a display area DA is folded in a curved shape. Because the flexible display module 500 according to one example embodiment has the same elements as those of the flexible display apparatus 10 illustrated in FIGS. 1 and 2, the same reference numerals are given to the elements of the flexible display module 500 and their repeated description will be omitted.

The first middle frame 510 supports the first supporting portion 111 of the first glass supporting member 110 included in the flexible display module 500, and surrounds sides of the flexible display module 500. The second middle frame 520 supports the second supporting portion 112 of the first glass supporting member 110 included in the flexible display module 500, and surrounds the sides of the flexible display module 500.

The hinge portion 530 rotatably supports each of the first middle frame 510 and the second middle frame 530 to enable unfolding and folding of the flexible display module 500. The hinge portion 530 according to one example embodiment may be made of an elastic material and coupled between the first middle frame 510 and the second middle frame 530. The hinge portion 530 made of the elastic material may be unfolded or folded by interacting with unfolding and folding of the flexible display module 500.

The hinge portion 530 according to another example embodiment may include a plurality of hinge blocks 531 and a plurality of elastic hinge axes 532. The plurality of hinge blocks 531 may be arranged in parallel between the first middle frame 510 and the second middle frame 520. The plurality of elastic hinge axes 532 support two adjacent hinge blocks 531 and changes an interval among the plurality of hinge blocks 531 in accordance with unfolding and folding of the flexible display module 500. For example, the plurality of elastic hinge axes 532 may be inserted between two adjacent hinge blocks 531 in an alternating type. The hinge portion 530 according to another example embodiment may have the same elements as those of the hinge portion disclosed in Korean Patent Laid-Open No. 10-2017-0026023 (foldable display apparatus).

The electronic device according to one example embodiment may further include a first back cover 540 and a second back cover 550. The first back cover 540 provides a first circuit storage space 541 on a rear surface of the first middle frame 510 by covering the rear surface of the first middle frame 510. The first circuit storage space 551 may be provided between the first middle frame 510 and the first back cover 540 to store some of peripheral circuits of the electronic device, such as a host driving system, a memory and a battery.

The second back cover 550 provides a second circuit storage space 551 on a rear surface of the second middle frame 520 by covering the rear surface of the second middle frame 520. The second circuit storage space 541 may be provided between the second middle frame 520 and the second back cover 550 to store the others of the peripheral circuits of the electronic device. At least one of the first back cover 540 and the second back cover 550 may be detachably coupled to the middle frames 540 and 550 for battery exchange according to battery discharge in the middle of using the electronic device. Alternatively, at least one of the first back cover 540 and the second back cover 550 may be coupled to the middle frames 540 and 550 detachably only during disassembly for repair of the electronic device. Each of the first back cover 540 and the second back cover 550 may be arranged on the rear surface of the outmost of the electronic device, and may include a plastic material, a metal material, or a glass material. For example, each of the first back cover 540 and the second back cover 550 may include a glass material having a color coating layer. The electronic device according to one example embodiment includes the flexible display apparatus 10 according to the example embodiment illustrated in FIGS. 1 and 2, and therefore may have the effects according to the flexible display apparatus 10.

Figure 17:
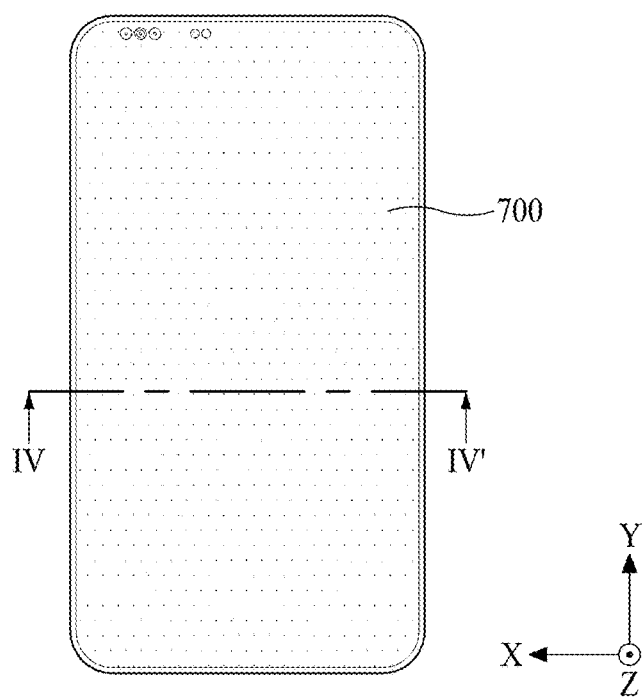
FIG. 17 illustrates an electronic device according to another example embodiment.
Figure 18:
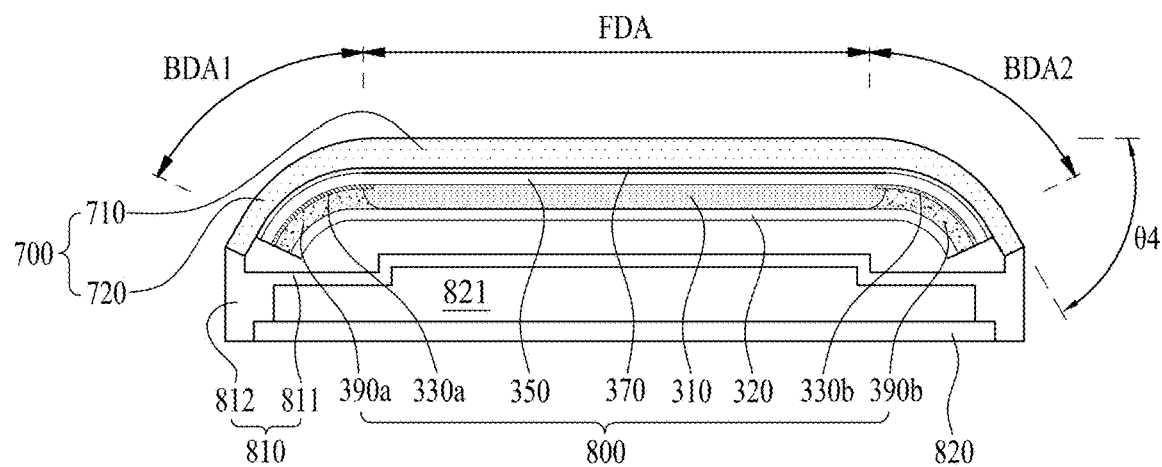
FIG. 18 is a cross-sectional view taken along line IV-IV' illustrated in FIG. 17.

FIG. 17 illustrates an electronic device according to another example embodiment, and FIG. 18 is a cross-sectional view taken along line IV-IV' illustrated in FIG. 17, in which the electronic device includes the flexible display apparatus illustrated in FIGS. 12 and 13. As illustrated in FIGS. 17 and 18, the electronic device according to another example embodiment may include a cover window 700, a flexible display module 800, and a middle frame 810. The cover window 700 may serve to protect the flexible display module 800 from external impact by covering a front surface and a side of the flexible display module 800.

The cover window 700 according to one example embodiment may be made of a transparent plastic material, a glass material, or a reinforcing glass material. As an example, the cover window 700 may have one or a deposited structure of sapphire glass and gorilla glass. As another example, the cover window 700 may include any one of polyethyleneterephthalate (PET), polycarbonate (PC), polyethersulfone (PES), polyethylenapthanate (PEN), and polynorborneen (PNB). The cover window 700 may be made of reinforcing glass in consideration of scratch and transparency.

The cover window 700 according to one example embodiment may include a flat window 710 and a curved window 720. The flat window 710 is a center portion of the cover window 700, and may be a transparent area through which light is transmitted. The flat window 710 may have flat shape. For example, the flat window 710 may be expressed as a front portion, flat portion, or front window. The curved window 720 may be bent from an edge area of the flat window 710 in a curved shape having at least one curvature radius. The curved window 720 according to one example embodiment may be bent from one side edge area and the other side edge area of the flat window 710. For example, the curved window 720 may have a curved shape and may be inclined from the flat window 710 at a fourth angle θ4, for example, 60°. Therefore, the curved window 720 may be curved from the flat window 710 in a curved shape and therefore may be expressed as a three-dimensional window or a three-dimensional sidewall window.

The cover window 700 may have a double-sided bending structure (or both edge bending structure) in which left and right edge areas are curved, whereby an esthetic sense of the electronic device may be improved, and a bezel area in a short side direction of the electronic device may be reduced. Additionally, the cover window 700 may further include a design (or decoration) layer provided on the edge area. The design layer may be printed on an inner edge area of the cover window 700, which faces the flexible display module 800, at least one time to cover a non-display area where an image is not displayed in the electronic device.

The flexible display module 800 may be coupled with the inner surface (or rear surface) of the cover window 700 to display an image or sense a user's touch. The flexible display module 800 may be bonded to the inner surface of the cover window 700 through a direct bonding process using a transparent adhesive member. The transparent adhesive bonding member may include a pressure sensitive adhesive (PSA), an optically clear adhesive (OCA), or an optically clear resin (OCR).

Because the flexible display module 800 according to one example embodiment has the substantially same elements as those of the flexible display apparatus 50 illustrated in FIGS. 12 and 13, the same reference numerals are given to the elements of the flexible display module 800 and repeated description thereof will be omitted. In the flexible display module 800, a flat display area FDA of the flexible display panel is attached to the flat window 710 of the cover window 700, and each of the bending display areas BDA1 and BDA2 of the flexible display panel is attached to the curved window 720 of the cover window 700. Each of the bending display areas BDA1 and BDA2 of the flexible display panel may be bent in a shape along a three-dimension of the curved window 720. Each of the first and second flexible substrates 330a and 330b and each of the first and second fillers 390a and 390b of the flexible display panel may be bent in a shape along a three-dimension of the curved window 720.

The flexible display module 800 according to one example embodiment may further include a radiation sheet 320 attached to the rear surface of the flexible display panel. The radiation sheet 320 may be attached to the rear surface of the flexible display panel to protect the flexible display panel from impact and radiate heat of the flexible display panel. The radiation sheet 320 according to one example embodiment may include a radiation sheet, a cushion member, and an adhesive member.

The radiation sheet may include a radiation layer having a metal material with relatively high heat conductivity. The radiation sheet according to one example embodiment may include a metal layer such as Cu. The radiation sheet according to another example embodiment may include a metal layer such as Cu and a graphite layer coated on the metal layer. The radiation sheet may have a radiation function, a ground function and a function of protecting the rear surface of the flexible display panel. The cushion member may include a foam tape coupled to the radiation sheet. The cushion member may serve to attenuate impact.

The adhesive member may be coupled with the cushion member. The adhesive member may include an uneven structure (or embossing structure) formed on a surface. The uneven structure of the adhesive member is able to omit a process for removing bubbles generated between the flexible display panel and the radiation sheet 320 by preventing bubbles from being generated between the flexible display panel and the radiation sheet 320 during attachment between the flexible display panel and the radiation sheet 320.

The middle frame 810 may support the cover window 700 and cover the rear surface of the flexible display module 800. The middle frame 810 may be arranged on the side of the outmost of the electronic device, and may include a plastic material or a metal material. The middle frame 810 may include a plastic material or a metal material having a color coating layer. The middle frame 810 according to one example embodiment may be made of a metal material, for example, aluminum material, which has relatively high heat conductivity, to improve radiation performance of the electronic device. The middle frame 810 according to one example embodiment may include a middle plate 811 and a middle sidewall 812.

The middle plate 811 may be arranged on the rear surface of the flexible display module 800. The middle plate 811 may include at least one open portion through which a cable for electrical connection between a display driving circuit connected to the flexible display module 800 and a host driving system passes, and at least one recessed portion in which various electronic circuit components built in the electronic device are arranged.

The middle sidewall 812 may vertically be coupled with a side of the middle plate 811 to support the curved window 720 of the cover window 700. For example, the middle sidewall 812 may be coupled with the curved window 720 of the cover window 700 by a double-sided tape or a waterproof tape. Waterproof performance of the electronic device may be improved, and permeation of particles may be avoided.

The electronic device according to one example embodiment may further include a back cover 820 for covering the rear surface (or back surface) of the middle frame 810. The back cover 820 may be coupled to the middle sidewall 812 to face the rear surface of the middle plate 811 and therefore provides a circuit storage space 821 on the rear surface of the middle frame 810 by covering the rear surface (or back surface) of the middle frame 810. The circuit storage space 821 may be provided between the middle plate 811 of the middle frame 810 and the back cover 820 to store peripheral circuits of the electronic device, such as a host driving system, a memory and a battery. The back cover 820 may detachably be coupled to the middle sidewall 812 for battery exchange according to battery discharge in the middle of using the electronic device, or may be coupled to the middle sidewall 812 detachably only during disassembly for repair of the electronic device.

The back cover 820 according to one example embodiment may be arranged on the rear surface of the outmost of the electronic device, and may include at least one of a plastic material, a metal material and a glass material and may include a color coating layer. For example, the back cover 820 according to one example embodiment may be a flat glass having a transparent, semi-transparent or opaque color coating layer. The back cover 820 according to another example embodiment may have the same shape as that of the cover window 700, and may include a glass material having a color coating layer. For example, the back cover 820 according to another example embodiment may have a symmetrical structure with the cover window 700 by interposing the middle frame 810, and may include a transparent, semi-transparent or opaque color coating layer.

Figure 19:
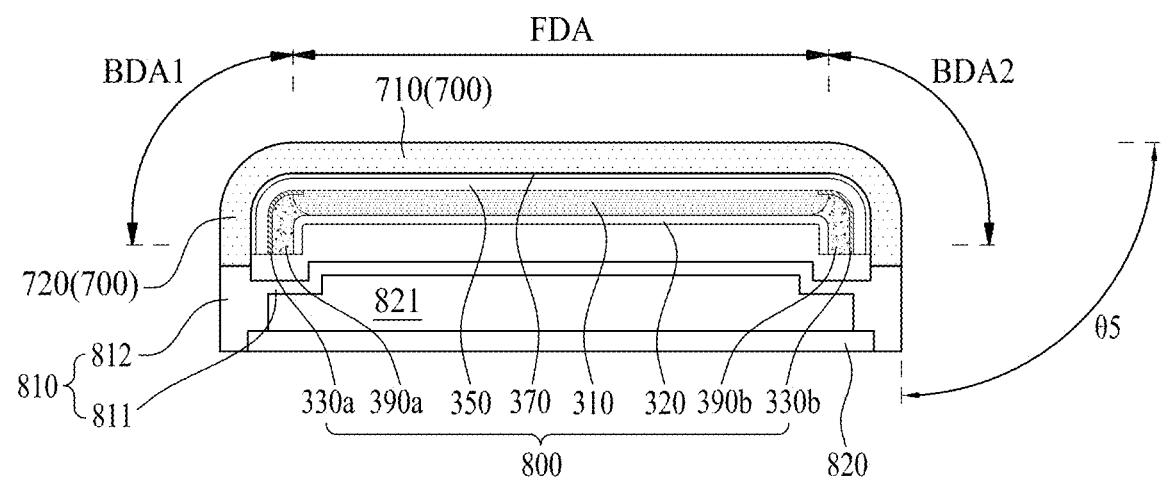
FIG. 19 is a cross-sectional view taken along line IV-IV' illustrated in FIG. 17.

The electronic device according to another example embodiment includes the flexible display apparatus 50 according to the example embodiment illustrated in FIGS. 11 and 12, and therefore may have the effects according to the flexible display apparatus 50. In the electronic device according to another example embodiment, the curved window 720, as illustrated in FIG. 19, may be inclined from the flat window 710 at 90° (θ5) while having a curved shape. Each of the first and second flexible substrates 330a and 330b of the flexible display panel and each of the first and second fillers 390a and 390b may be bent in a shape along a three-dimension of the curved window 720 inclined from the flat window 710 at 90° (θ5). On the other hand, in the electronic device according to another example embodiment, angles θ4 and θ5 between the flat window 710 and the curved window 720 may be set to an acute angle including 60° and 90° illustrated in FIG. 18, or 90° illustrated in FIG. 19.

The flexible display apparatus and the electronic device comprising the same according to the present disclosure may be described as follows.

A flexible display apparatus according to one example embodiment may include a glass supporting member including a flat portion and a step difference portion overlapping the flat portion; a flexible substrate in the step difference portion of the glass supporting member; and a display portion including a plurality of pixels on the glass supporting member and the flexible substrate.

According to one example embodiment, the flexible substrate is configured to be folded or unfolded in a curved shape.

According to one example embodiment, the display portion includes: a plurality of flat display areas overlapping the flat portion, and including a plurality of bending display areas, wherein the plurality of bending display areas is configured to be folded in a curved shape in accordance with bending of the flexible substrate.

According to one example embodiment, the display portion includes a bending display area overlapping the flexible substrate, and first and second flat display areas overlapping the flat portion, wherein the first and second flat display areas are parallel.

According to one example embodiment, the first supporting portion includes: a first flat portion supporting the first flat display area; a first step difference portion at an inner edge area of the first supporting portion, and supporting the first side edge area of the flexible substrate; and a first glass etching surface on an inner side of the first flat portion and exposed to a flexible filler.

According to one example embodiment, the second supporting portion includes: a second flat portion supporting the second flat display area; a second step difference portion at an inner edge area of the second supporting portion, supporting the second side edge area of the flexible substrate; and a second glass etching surface on an inner side of the second flat portion and exposed to a flexible filler.

According to one example embodiment, the flexible substrate has a width wider than a width of the filler.

According to one example embodiment, the display portion includes: a flat display area overlapping the flat portion; a first bending display area extending from a first side of the flat display area; and a second bending display area extending from the second side of the flat display area, wherein each of the first bending display area and the second bending display area is bent from the flat display area in a curved shape.

According to one example embodiment, the glass supporting member includes: a flat portion supporting the flat display area; a first step difference portion at a first side edge area of the flat portion, and overlapping the first bending display area, wherein the first step difference portion supports the first side edge area of the flexible substrate; and a second step difference portion at a second side edge area of the flat portion, and overlapping the second bending display area, wherein the second step difference portion supports the second side edge area of the flexible substrate.

According to one example embodiment, the flexible substrate includes: a first flexible substrate in the first step difference portion, supporting the first bending display area; and a second flexible substrate in the second step difference portion, supporting the second bending display area.

According to one example embodiment, the glass supporting member includes: a first glass etching surface at a first side of the flat portion, exposing a side edge area of a rear surface of the first flexible substrate; and a second glass etching surface at a second side of the flat portion, exposing a side edge area of the second flexible substrate.

According to one example embodiment, the flexible display apparatus includes: a first filler on the edge area of the rear surface of the first flexible substrate and the first glass etching surface; and a second filler on a side edge area of a rear surface of the second flexible substrate and the second glass etching surface.

According to one example embodiment, the first glass etching surface has a curved shape or a tapered shape.

According to one example embodiment, the glass supporting member includes: a first supporting portion supporting a first flat display area and a first side edge area of the flexible substrate; a second supporting portion supporting a second flat display area and a second side edge area of the flexible substrate; and a flexible filler between the first supporting portion and the second supporting portion, wherein the flexible substrate is between the first supporting portion and the second supporting portion, and overlaps the flexible filler.

An electronic device according to one example embodiment may include: a display portion including first and second flat display areas that are parallel to each other, and a bending display area between the first flat display area and the second flat display area; a flexible substrate supporting the bending display area; a glass supporting member including a first supporting portion supporting the first flat display area and a first side edge area of the flexible substrate, a second supporting portion supporting the second flat display area and a second side edge area of the flexible substrate, and a flexible filler between the first supporting portion and the second supporting portion; a first middle frame supporting the first supporting portion; a second middle frame supporting the second supporting portion; and a hinge portion supporting each of the first middle frame and the second middle frame.

According to one example embodiment, the first supporting portion includes a first step difference portion supporting the first side edge area of the flexible substrate, and the second supporting portion includes a second step difference portion supporting the second side edge area of the flexible substrate.

According to one example embodiment, the first supporting portion further includes a first glass etching surface connected to the first step difference portion and exposed to the flexible filler, the second supporting portion further includes a second glass etching surface connected to the second step difference portion and exposed to the flexible filler, and the glass supporting member further includes a filler filled in the flexible filler overlapping the flexible substrate, and covering the first glass etching surface and the second glass etching surface.

According to one example embodiment, the flexible substrate has a width wider than a width of the filler.

An electronic device according to one example embodiment may include: a cover window including a front window and a curved window that is curved from the front window; and a flexible display module including a flexible display panel coupled to the front window, wherein the flexible display panel includes: a display portion including a flat display area attached to the front window and first and second bending display areas extended from the flat display area and attached to the curved window; and a glass supporting member supporting the flat display area; a first flexible substrate supported at a first side edge area of the glass supporting member, supporting the first bending display area; and a second flexible substrate supported at a second side edge area of the glass supporting member, supporting the second bending display area.

According to one example embodiment, the glass supporting member includes: a flat portion supporting the flat display area; a first step difference portion at a first side edge area of the flat portion, supporting a side edge area of the first flexible substrate; and a second step difference portion at a second side edge area of the flat portion, supporting a side edge area of the second flexible substrate.

According to one example embodiment, the glass supporting member includes: a first glass etching surface at a first side of the flat portion and connected to the first step difference portion; and a second glass etching surface at a second side of the flat portion and connected to the second step difference portion.

According to one example embodiment, the flexible display panel further includes: a first filler covering the first glass etching surface and a rear surface of the first flexible substrate; and a second filler covering the second glass etching surface and a rear surface of the second flexible substrate.

It will be apparent to those skilled in the art that various modifications and variations can be made in the flexible display apparatus and an electronic device comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display apparatus, comprising:
a glass supporting member including a flat portion and a step difference portion overlapping the flat portion;
a flexible substrate in the step difference portion of the glass supporting member; and
a display portion including a plurality of pixels on the glass supporting member and the flexible substrate,
wherein the glass supporting member includes:
an open portion penetrating an upper surface and a lower surface of the glass supporting member;
a first supporting portion provided on one side of the open portion;
a second supporting portion provide on the other side of the open portion;

a first step difference portion having a certain depth from an upper surface of an inner edge area of the first supporting portion adjacent to the open portion; and a second step difference portion having a certain depth from an upper surface of an inner edge area of the second supporting portion adjacent to the open portion, wherein the first and second step difference portions are spaced apart from each other with the open portion therebetween, wherein the flexible substrate is disposed to overlap the first and second step difference portions and the open portion, and wherein the flexible substrate is directly coupled to an upper surface of the first and second step difference portions.

2. The flexible display apparatus of claim 1, wherein the flexible substrate is configured to be folded or unfolded in a curved shape.

3. The flexible display apparatus of claim 1, wherein the display portion includes: a plurality of flat display areas overlapping the flat portion, and including a plurality of bending display areas, wherein the plurality of bending display areas is configured to be folded in a curved shape in accordance with bending of the flexible substrate.

4. The flexible display apparatus of claim 1, wherein the display portion includes a bending display area overlapping the flexible substrate, and first and second flat display areas overlapping the flat portion, wherein the first and second flat display areas are parallel.

5. The flexible display apparatus of claim 4, wherein the first supporting portion includes:

a first flat portion supporting the first flat display area;

the first step difference portion supporting the first side edge area of the flexible substrate; and a first glass etching surface on an inner side of the first flat portion and exposed to a flexible filler.

6. The flexible display apparatus of claim 5, wherein the first glass etching surface has a curved shape or a tapered shape.

7. The flexible display apparatus of claim 4, wherein the second supporting portion includes:

a second flat portion supporting the second flat display area;

the second step difference portion supporting the second side edge area of the flexible substrate; and a second glass etching surface on an inner side of the second flat portion and exposed to a flexible filler.

8. The flexible display apparatus of claim 7, wherein the flexible substrate has a width wider than a width of the filler.

9. The flexible display apparatus of claim 1, wherein the glass supporting member includes:

the first supporting portion supporting a first flat display area and a first side edge area of the flexible substrate;

the second supporting portion supporting a second flat display area and a second side edge area of the flexible substrate; and a flexible filler between the first supporting portion and the second supporting portion, wherein the flexible substrate is between the first supporting portion and the second supporting portion, and overlaps the flexible filler.

10. The electronic device of claim 1, wherein the display portion is directly coupled to an upper surface of the glass supporting member and the flexible substrate.

* * * * *